(12) United States Patent
Lee et al.

(10) Patent No.: US 12,022,694 B2
(45) Date of Patent: Jun. 25, 2024

(54) DISPLAY PANEL, DISPLAY APPARATUS INCLUDING THE SAME, AND METHOD FOR MANUFACTURING THE DISPLAY PANEL

(71) Applicant: Samsung Display Co., Ltd., Yongin-si (KR)

(72) Inventors: Yeonhwa Lee, Hwaseong-si (KR); Jaeik Kim, Seoul (KR); Joongu Lee, Seoul (KR); Hye Jin Gwark, Suwon-si (KR); Jungsun Park, Yongin-si (KR); Heemin Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/203,949

(22) Filed: May 31, 2023

(65) Prior Publication Data
US 2023/0329043 A1    Oct. 12, 2023

Related U.S. Application Data

(62) Division of application No. 17/224,426, filed on Apr. 7, 2021, now Pat. No. 11,706,952.

(30) Foreign Application Priority Data

Aug. 7, 2020   (KR) .................. 10-2020-0099466

(51) Int. Cl.
*H10K 59/122* (2023.01)
*H10K 71/00* (2023.01)

(52) U.S. Cl.
CPC .......... *H10K 59/122* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 10,074,705 B2 | 9/2018 | Chung et al. | |
| 10,332,859 B2 | 6/2019 | Nakamura et al. | |
| 2018/0370231 A1* | 12/2018 | Sato | B41J 2/1433 |
| 2019/0372057 A1 | 12/2019 | Park et al. | |
| 2020/0185643 A1 | 6/2020 | Moon et al. | |
| 2021/0138766 A1* | 5/2021 | Klein | B32B 17/10788 |
| 2021/0159451 A1 | 5/2021 | Cui et al. | |
| 2022/0173246 A1 | 6/2022 | Yanagisawa et al. | |

FOREIGN PATENT DOCUMENTS

| | | |
|---|---|---|
| KR | 1020170129318 A | 11/2017 |
| KR | 1020190135848 A | 12/2019 |

* cited by examiner

*Primary Examiner* — Michelle Mandala
(74) *Attorney, Agent, or Firm* — CANTOR COLBURN LLP

(57) ABSTRACT

A display panel includes an emitting part including a light emitting element and a transmitting part adjacent to the emitting part and including a low adhesion part including a carbon compound. The low adhesion pattern includes fluorine (F).

3 Claims, 27 Drawing Sheets

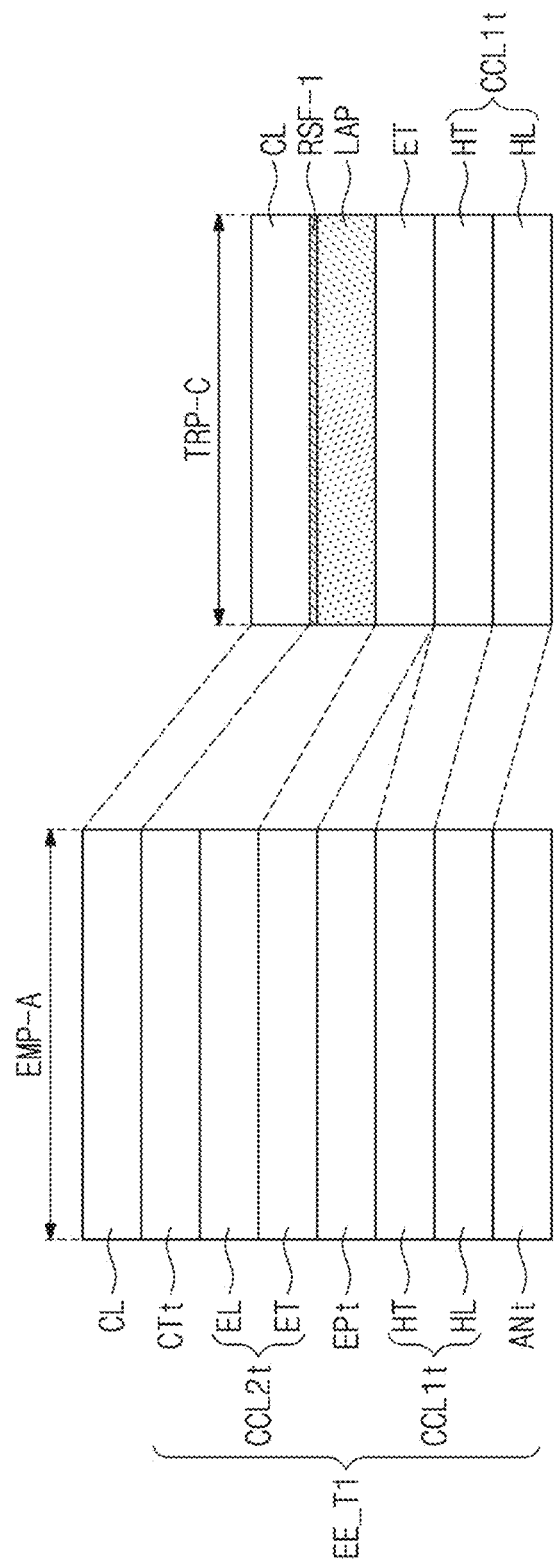

DISPLAY PANEL, DISPLAY APPARATUS INCLUDING THE SAME, AND METHOD FOR MANUFACTURING THE DISPLAY PANEL

This application is a divisional of U.S. patent application Ser. No. 17/224,426, filed on Apr. 7, 2021, which claims priority to Korean Patent Application No. 10-2020-0099466, filed on Aug. 7, 2020, and all the benefits accruing therefrom under 35 U.S.C. § 119, the content of which in its entirety is herein incorporated by reference.

BACKGROUND

1. Field

Embodiments of the invention herein relate to a display panel, a display apparatus including the same, and a method for manufacturing the display panel, and more particularly, to a display panel including a transparent area, a display apparatus including the same, and a method for manufacturing the display panel.

2. Description of the Related Art

Display apparatuses are activated according to electrical signals. The display apparatuses may include a panel that displays an image. In the display panel, an organic light emitting display panel has various advantages such as low power consumption, high luminance, and a high response speed.

The display apparatuses may include an electronic module that receives an external signal or provides an output signal to the outside. The electronic module is accommodated in an outer case or the like together with the display panel to constitute an electronic apparatus.

SUMMARY

Embodiments of the invention provide a display panel including a transparent area and a display apparatus including the same.

Embodiments of the invention also provide a method for manufacturing a display panel, which is capable of easily forming a transparent area without a separate mask or an additional process.

An embodiment of the invention provides a display panel including an emitting part including a light emitting element, and a transmitting part spaced apart from the emitting part and including a low adhesion pattern including a carbon compound, where the low adhesion pattern includes fluorine (F).

In an embodiment, the light emitting element may include a first electrode, a second electrode disposed on the first electrode, and an emitting pattern disposed between the first electrode and the second electrode, and the first electrode and the second electrode may be spaced apart from the transmitting part in a plan view.

In an embodiment, the emitting pattern may be spaced apart from the transmitting part in the plan view.

In an embodiment, the transmitting part may further include a residual part disposed on the low adhesion pattern, and the residual part may include a material identical to a material of the second electrode.

In an embodiment, the light emitting element may further include a first charge control layer disposed between the first electrode and the emitting pattern and a second charge control layer disposed between the second electrode and the emitting pattern, and the first charge control layer may overlap the transmitting part and is disposed below the low adhesion pattern.

In an embodiment, the second charge control layer may not overlap the transmitting part in the plan view.

In an embodiment, the second charge control layer may overlap the transmitting part and is disposed below the low adhesion pattern.

In an embodiment, the display panel may further include a residual part disposed on the low adhesion pattern, and the residual part may include a material identical to at least one of a material of the second charge control layer and a material of the second electrode.

In an embodiment, the display panel may further include a capping layer which overlaps the emitting part and the transmitting part and is disposed on the second electrode, where the capping layer may be disposed on the low adhesion pattern.

In an embodiment, the emitting part may be provided in plural to be disposed spaced apart from each other, and the transmitting part may be provided in plural to be disposed respectively adjacent to emitting parts.

In an embodiment, the emitting part may be provided in plural to be disposed spaced apart from each other, and a portion of emitting parts may be adjacent to the transmitting part.

In an embodiment of the invention, a display apparatus includes a display panel including an emitting part which includes a first electrode, a second electrode, and an emitting pattern disposed between the first electrode and the second emission, and a transmitting part spaced apart from the first electrode, and an electronic module overlapping the transmitting part in a plan view, where the transmitting part includes a low adhesion pattern spaced apart from the first electrode in the plan view, and the low adhesion pattern includes a fluorine-based carbon compound.

In an embodiment, a size of an area of the low adhesion pattern may be equal to a size of an area of the emitting pattern.

In an embodiment, a size of a planar area of the low adhesion pattern may be a planar area greater than a size of a planar area of the emitting pattern, and the electronic module may overlap the low adhesion pattern.

In an embodiment, the second electrode may not overlap the low adhesion pattern in the plan view.

In an embodiment, the light emitting element may further include a charge control layer disposed between the emitting pattern and the second electrode, and the charge control layer may not overlap the low adhesion pattern in the plan view.

In an embodiment, the display panel may further include a first light emitting element including an emitting pattern including a first planar surface and a second light emitting element including an emitting pattern including a second planar surface having a size greater than a size of the first planar surface, and the low adhesion pattern may include a planar surface having a size less than the size of the second planar surface.

In an embodiment of the invention, a method for manufacturing a display panel includes forming a first electrode on a base substrate, forming a pixel defining layer on the first electrode, defining an opening in the pixel defining layer so that at least a portion of the first electrode is exposed, forming an emitting pattern in the opening, forming a low adhesion pattern, which including a fluorine-based carbon compound, on an area spaced apart from the first electrode, and forming a second electrode on the emitting pattern, where a material forming the second electrode is disposed on the emitting pattern and the low adhesion pattern, and the second electrode is formed so that at least a portion of the low adhesion pattern is exposed.

In an embodiment, the method may further include forming a charge control layer between the emitting pattern and the second electrode, where a material forming the charge control layer may be provided on the emitting pattern and the low adhesion pattern, and the charge control layer may be formed so that at least a portion of the low adhesion pattern is exposed.

In an embodiment, a portion of the material forming the second electrode may remain on the low adhesion pattern to form a residual part.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 6A to 6D are cross-sectional views illustrating an embodiment of a portion of the display panel according to the invention;

DETAILED DESCRIPTION

Figure 1:
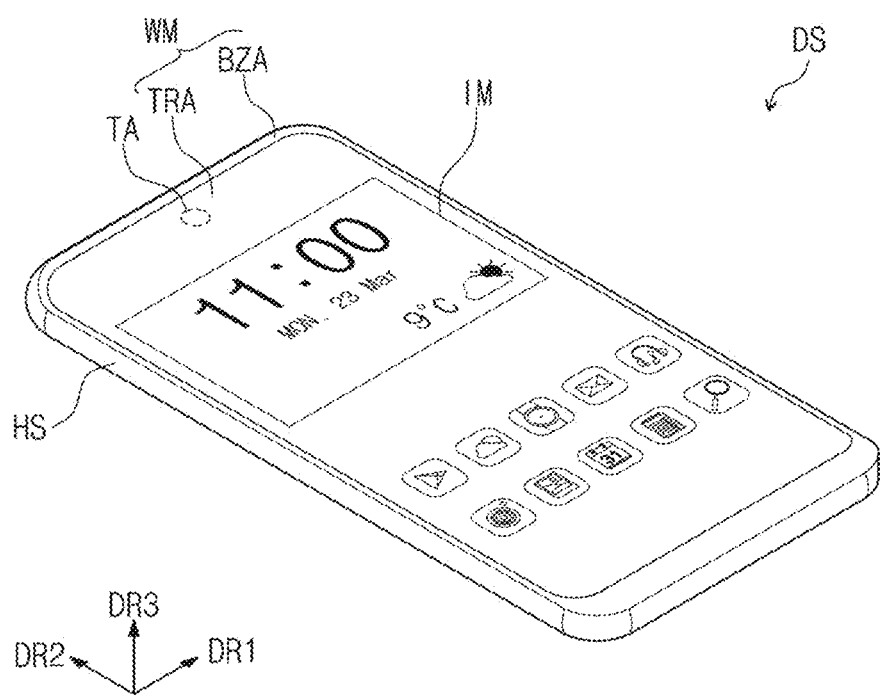
FIG. 1 is a coupling perspective view of an embodiment of a display apparatus according to the invention.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. A first element referred to as a first element in one embodiment can be also referred to as a second element in another embodiment without departing from the scope of the appended claims, for example. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the invention will be described with reference to the accompanying drawings.

Figure 2:
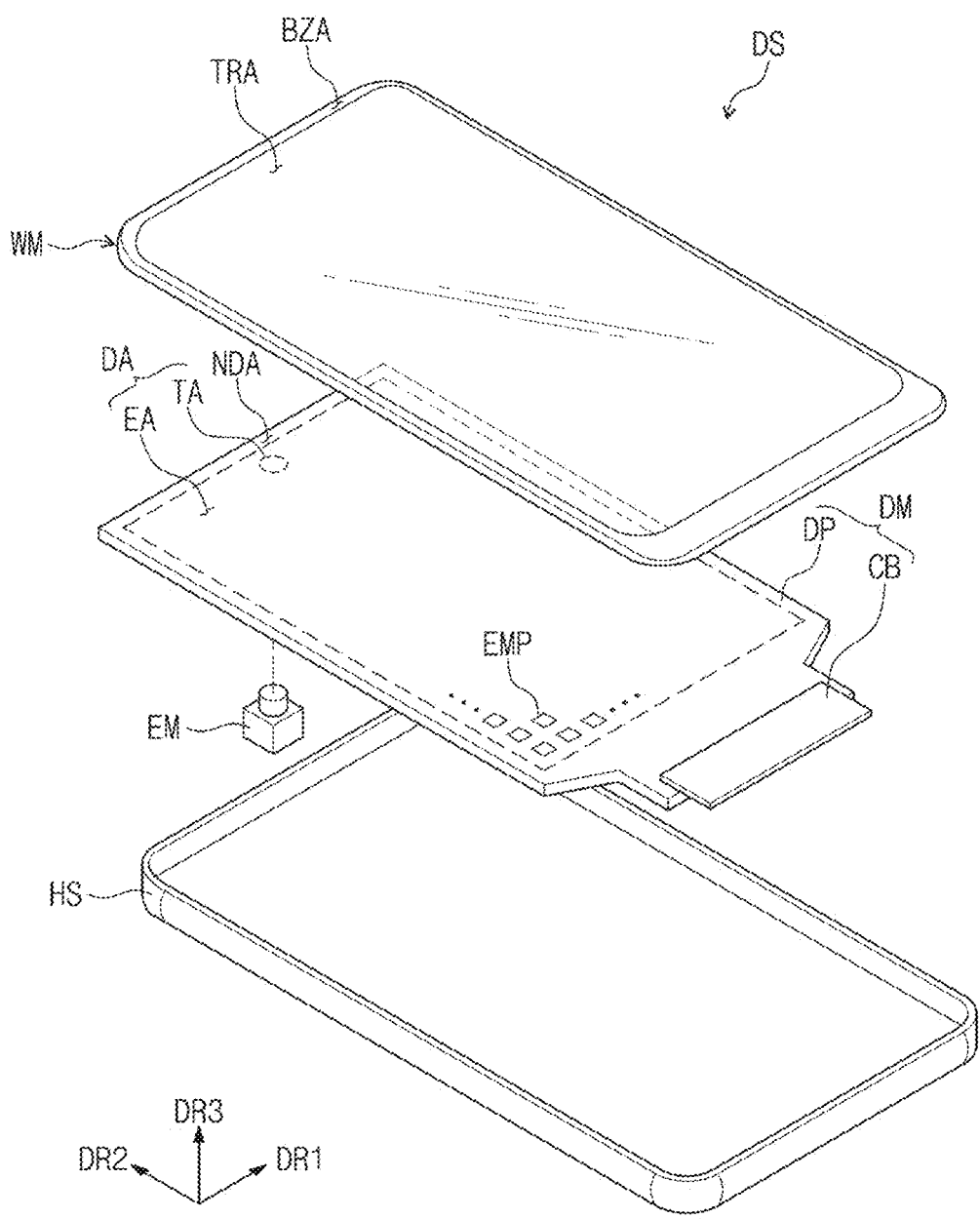
FIG. 2 is an exploded perspective view of the display apparatus of FIG. 1.

FIG. 1 is a coupling perspective view of an embodiment of a display apparatus according to the invention. FIG. 2 is an exploded perspective view of the display apparatus of FIG. 1. Hereinafter, embodiments according to the invention will be described with reference to FIGS. 1 and 2.

The display apparatus DS may be an apparatus that displays an image IM. In an embodiment, the display apparatus DS may include a tablet, a notebook, a computer, a smart phone, television, and the like, for example. In this embodiment, the display apparatus DS including the smart phone will be described as an example.

The user receives information through the image IM displayed on a display area DA. The image IM may include at least one of a static image or a moving image. In FIG. 1, a watch and a plurality of icons are illustrated as an example of the image IM.

The display apparatus DS may include a window WM, a display module DM, an electronic module EM, and a housing unit HS. The window WM is coupled to the housing unit HS to define an outer appearance of the display apparatus DS.

The window WM may include an optically transparent insulating material. In an embodiment, the window WM may include glass or plastic, for example. The window WM may have a single layer or multilayered structure. In an embodiment, the window WM may have a laminated structure of a plurality of plastic films bonded to each other by an adhesive or a laminated structure of a glass substrate and a plastic film, which are bonded to each other by an adhesive, for example.

The window WM includes a transparent area TRA and a bezel area BZA. The transparent area TRA may be an optically transparent area. The image IM generated by the display module DM may be visually recognized from the outside of the display apparatus DS through the transparent area TRA.

The transparent area TRA may have a shape corresponding to that of a display area DA that will be described later. The transparent area TRA may have a rectangular (e.g., square) shape that is parallel to a first direction DR1 and a second direction DR2. However, this is merely an example. In another embodiment, the transparent area TRA may have various shapes and is not limited to any particular embodiment, for example.

The bezel area BZA is adjacent to the transparent area TRA. The bezel area BZA may be an area HA having a light transmittance that is relatively less than that of the transparent area TRA. When the window WM is provided as a glass or plastic substrate, the bezel area BZA may be a color layer that is printed or disposed on one surface of the glass or plastic substrate. In an alternative embodiment, the bezel area BZA may be provided by coloring a corresponding area of the glass or plastic substrate.

The bezel area BZA defines a shape of a second area TA. The bezel area BZA may be disposed adjacent to the transparent area TRA to surround the transparent area TRA. However, this is merely an example. In another embodiment, the bezel area BZA may be disposed adjacent to only one side of the transparent area TRA or be omitted, for example.

A direction DR3 (hereinafter, a third direction) perpendicular to the transparent area TRA may correspond to a thickness direction of the display apparatus DS. The image IM is displayed in the third direction DR3. In this embodiment, a front surface (or a top surface) or a rear surface (or a bottom surface) of each of members may be defined based on a direction in which the image IM is displayed. The front and rear surfaces may be opposite to each other in the third direction DR3.

The directions indicated as the first to third direction DR1, DR2, and DR3 may be a relative concept and thus changed into different directions. Hereinafter, the first to third directions may be directions indicated by the first to third directions DR1, DR2, and DR3 and designated by the same reference numerals, respectively.

The display module DM is disposed between the window WM and the housing unit HS. The display module DM may be accommodated in a space provided by coupling the window WM to the housing unit HS. The display module DM may include a display panel DP and a circuit board CB.

The front surface of the display panel DP includes a display area DA and a peripheral area NDA. The display panel DP includes an emitting part EMP. The emitting part EMP displays light. The emitting part EMP may be provided in plural and disposed in the display area DA. The display area DA may be an area displaying the image IM.

The display area DA includes a first area EA and the second area TA. The first area EA and the second area TA may have different transmittances.

The second area TA may overlap the electronic module EM in a plan view. The second area TA may be an area having a light transmittance that is relatively greater than that of the first area EA.

A relatively small number of emitting parts EMP may be disposed in the second area TA when compared to the first area EA. In an embodiment, a density of each of the emitting parts EMP disposed in the second area TA may be less than that of each of the emitting parts EMP disposed in the first area EA, for example. In an alternative embodiment, the emitting part EMP may not be disposed in the second area TA.

The second area TA is defined adjacent to the first area EA. In this embodiment, the entire second area TA is defined as being surrounded by the first area EA. However, this is merely an example. In another embodiment, the second area TA may be defined at a position that is partially adjacent to the first area EA or may be provided in various shapes in addition to a circle shape, for example, and is not limited to any particular embodiment.

The peripheral area NDA is adjacent to the display area DA. Driving circuits for driving the emitting parts EMP may be disposed on the peripheral area NDA.

The circuit board CB is connected to the display panel DP. The circuit board CB is illustrated as being coupled to the display panel DP on the peripheral area NDA. The circuit board CB is electrically connected to the display panel DP. Various electronic elements for driving the emitting parts EMP may be disposed (e.g., mounted) on the circuit board CB. However, this is merely an example. In another embodiment, various electronic elements for driving the emitting parts EMP may be disposed (e.g., mounted) on the display panel DP. Here, the circuit board CB may be omitted, for example. The display apparatus DS in an embodiment of the invention may be implemented according to various embodiments, but is not limited to any particular embodiment.

The electronic module EM is disposed between the window WM and the housing unit HS. The electronic module EM may be accommodated in a space provided by coupling the window WM to the housing unit HS. The electronic module EM overlaps the display panel DP in a plan view.

The electronic module EM overlaps the display area DA of the display panel DP in a plan view and overlaps the transparent area TRA of the window WM in a plan view. The electronic module EM overlaps the second area TA of the display area DA.

The electronic module EM may include a photographing module such as a camera, a light receiving module such as an infrared sensor, an acoustic module such as a speaker, and a module such as an ultrasonic sensor. In this embodiment, the electronic module EM may photograph a subject existing outside the display apparatus DS through the second area TA or may receive an external input, e.g., touch or light, provided to the transparent area TRA. Since the electronic module EM overlaps the display panel DP, the bezel area BZA may be prevented from increasing, and a narrow bezel display apparatus or a borderless display apparatus may be provided.

Figure 3A:
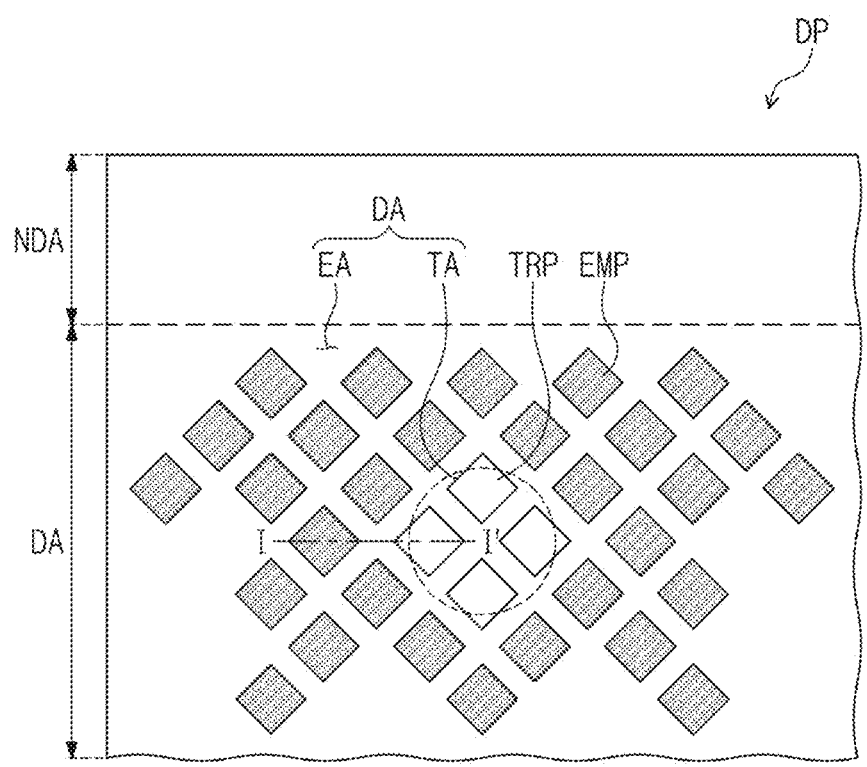
FIG. 3A is a schematic plan view illustrating a portion of a display panel of FIG. 2.
Figure 3B:
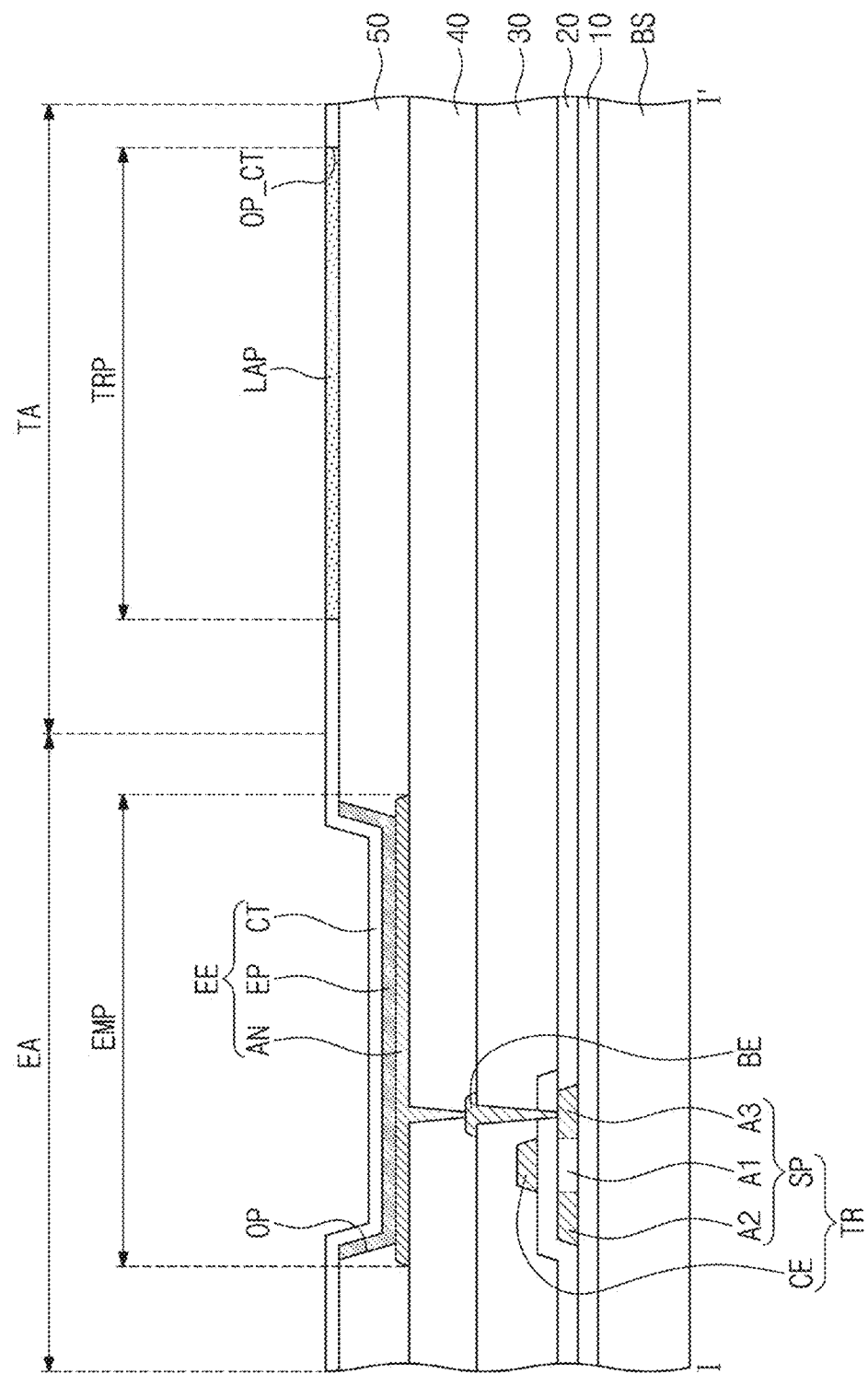
FIG. 3B is a cross-sectional view taken along line I-I' of FIG. 3A.
Figure 3C:
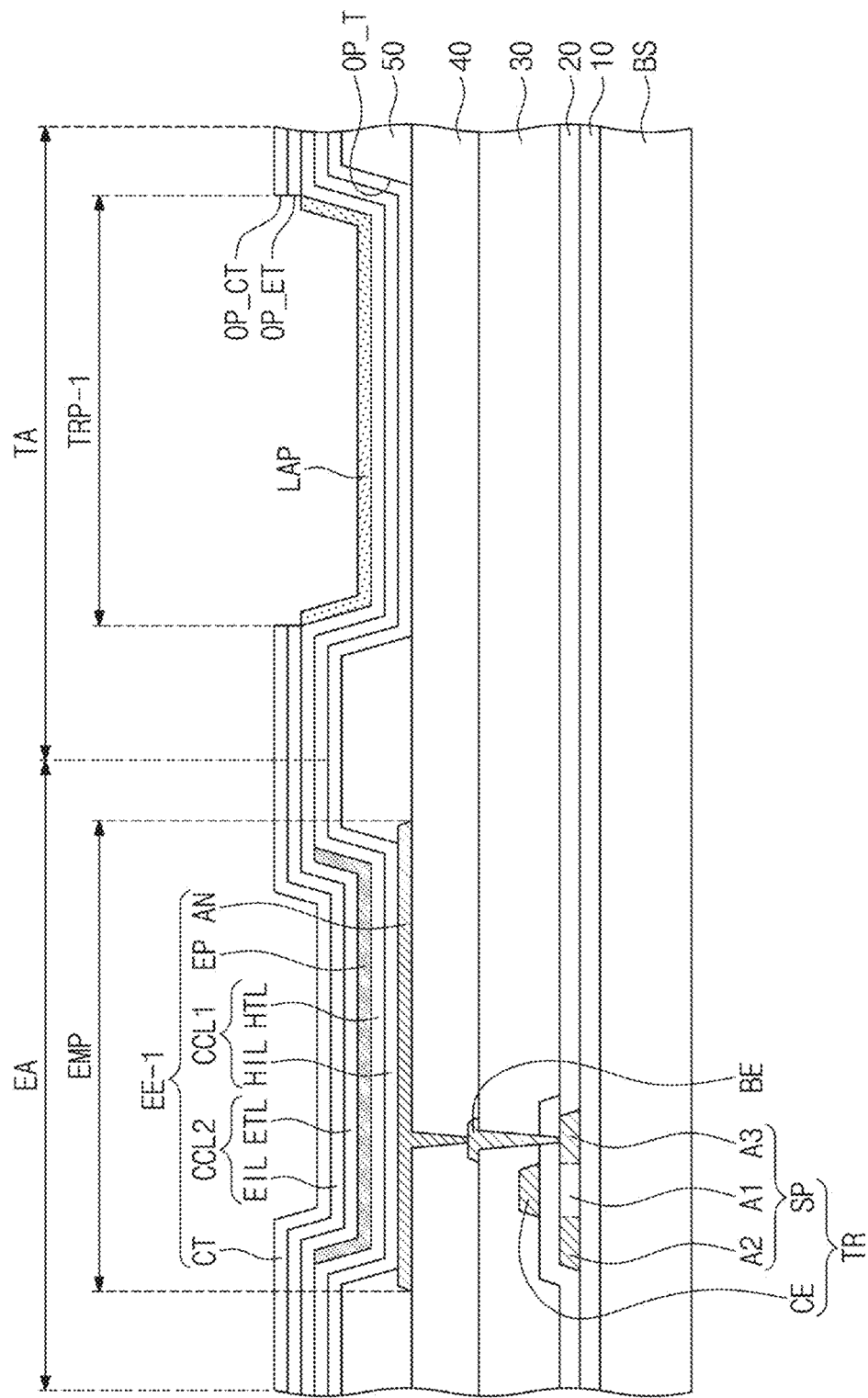
FIG. 3C is a cross-sectional view of an embodiment of the display panel according to the invention.

FIG. 3A is a schematic plan view illustrating a portion of the display panel of FIG. 2. FIG. 3B is a cross-sectional view taken along line I-I' of FIG. 3A. FIG. 3C is a cross-sectional view of an embodiment of the display panel according to the invention. FIG. 3C illustrates an area corresponding to that of FIG. 3B. Hereinafter, an embodiment of the invention will be described with reference to FIGS. 3A to 3C.

The display panel DP includes the emitting part EMP and a transmitting part TRP. A planar shape of the emitting part EMP corresponds to an emission area of one light emitting element EE. In this embodiment, the emitting part EMP is illustrated as being provided in a rectangular shape. The emitting part EMP may be provided in plural to be spaced apart from each other on the first area EA.

The transmitting part TRP includes a low adhesion pattern LAP. A planar shape of the transmitting part TRP is illustrated as being provided in a rectangular shape corresponding to that of the emitting part EMP. However, this is merely an example. In another embodiment, the planar shape of the transmitting part TRP may be provided as a different shape that is independent from that of the emitting part EMP, for example.

The transmitting part TRP is disposed in the second area TA. In this embodiment, the transmitting part TRP is provided in plural to be spaced apart from each other on the second area TA. However, this is merely an example. In another embodiment, the transmitting part TRP may be provided on the second area as a single part or may be provided in various shapes in addition to the rectangular shape, for example, but is not limited to any particular embodiment.

A cross-sectional structure of the display panel DP will be described with reference to FIG. 3B. For easy explanation, FIG. 3B illustrates a base substrate BS, a plurality of insulating layers 10, 20, 30, 40, and 50, an embodiment of the emitting part EMP, and an embodiment of the transmitting part TRP among constituents of the display panel DP. The base substrate BS may be optically transparent and have an insulating property. In an embodiment, the base substrate BS may include glass, plastic, a polymer film, or a multi-layer structure including an organic layer and an inorganic layer, for example.

The insulating layers 10, 20, 30, 40, and 50 may include first to fifth insulating layers 10, 20, 30, 40, and 50, which are laminated on the base substrate BS. Each of the first to fifth insulating layers 10, 20, 30, 40, and 50 may be an organic layer or an inorganic layer. In an embodiment, each of the first insulating layer 10 and the second insulating layer 20 may be an inorganic layer, and each of the third to fifth insulating layers 30, 40, and 50 may be an organic layer, for example. However, this is merely an example. In another embodiment, each of the first to fifth insulating layers 10, 20, 30, 40, and 50 is not limited to any particular embodiment. Also, the insulating layers 10, 20, 30, 40, and 50 may further include an additional insulating layer in addition to the five insulating layers, but are not limited to any particular embodiment.

The emitting part EMP includes a light emitting element EE and a thin film transistor TR. The thin film transistor TR may include a semiconductor pattern SP and a control electrode CE. The semiconductor pattern SP is disposed between the first insulating layer 10 and the second insulating layer 20.

The semiconductor pattern SP may include a channel part A1, an input part A2, and an output part A3. The channel part A1, the input part A2, and the output part A3 may be portions that are divided in a plan view of the semiconductor pattern SP. The channel part A1 may have conductivity less than that of each of the input part A2 and the output part A3.

In this embodiment, each of the input part A2 and the output part A3 may include a reduced metal. The input part A2 and the output part A3 may function as a source electrode and a drain electrode of the first transistor TR1. However, this is merely an example. In another embodiment, the first transistor TR1 may further include separate source and drain electrodes contacting the input unit A2 and the output unit A3, for example, but is limited to any particular embodiment.

The control electrode CE has conductivity. The control electrode CE is spaced apart from the semiconductor pattern SP with a second insulating layer 20 therebetween. The control electrode CE overlaps the channel part A1 of the semiconductor pattern SP in a plan view.

The light emitting element EE is disposed on the thin film transistor TR. In this embodiment, the light emitting element EE is disposed on the fourth insulating layer 40 and is connected to the thin film transistor TR through a separately provided connection electrode BE. The connection electrode BE may pass through the second insulating layer 20 and the third insulating layer 30 so as to be connected to the output part A3 of the thin film transistor TR, and the light emitting element EE may pass through the fourth insulating layer 40 so as to be connected to the connection electrode BE. However, this is merely an example. In another embodiment of the display panel DP according to the invention, the connection electrode BE may be disposed at another position or omitted, but is not limited to any particular embodiment, for example.

The light emitting element EE includes a first electrode AN, a second electrode CT, and an emitting pattern EP. The first electrode AN is disposed between the fourth insulating layer 40 and the fifth insulating layer 50. At least a portion of the first electrode AN is exposed by an opening OP defined in the fifth insulating layer 50.

The emitting pattern EP is disposed in the opening OP to overlap the exposed first electrode AN. The light emitting pattern EP includes a low molecular organic light emitting material or a high molecular organic light emitting material and also may include fluorescence or phosphorescence. In an alternative embodiment, the emitting pattern EP may include an inorganic light emitting material such as quantum dots, nanorods, micro light emitting diodes ("LEDs"), nano LEDs, and the like. The light emitting element EE in an embodiment of the invention may include various light emitting materials as long as the light emitting material generates light, but is not limited to any particular embodiment.

The second electrode CT may be disposed on the emitting pattern EP to face the first electrode AN. The second electrode CT may be unitary with the front surface of the display panel DP. However, this is merely an example. In another embodiment, the second electrode CT may have a shape similar to that of the first electrode AN and may be patterned for each emitting part EMP, for example, but is not limited to any particular embodiment.

The transmitting part TRP may be spaced apart from the emitting part EMP in a plan view. The transmitting part TRP includes a low adhesion pattern LAP. The low adhesion pattern LAP is spaced apart from the first electrode AN in a plan view. The low adhesion pattern LAP does not overlap the first electrode AN in a plan view. The low adhesion pattern LAP may be spaced apart from the second electrode CT in a plan view.

The low adhesion pattern LAP includes fluorine (F). In an embodiment, the low adhesion pattern LAP may include a fluorine-based carbon compound, for example. The low adhesion pattern LAP may include a material in which at least one hydrogen of a carbon compound is substituted with fluorine.

The low adhesion pattern LAP may have optical transparency. The low adhesion pattern LAP has a light transmittance greater than that of each of second electrodes CT and CTt (refer to FIGS. 6A to 6D). In an embodiment, the low adhesion pattern LAP may have a light transmittance of about 80% or more, for example.

In this embodiment, the low adhesion pattern LAP may be disposed in a second opening OP_T defined in the fifth insulating layer 50. The second opening OP_T is spaced apart from the opening OP and defined in the transmitting part TRP.

In this case, the second electrode CT may not be disposed on the transmitting part TRP. Particularly, an opening OP_CT having a shape corresponding to that of the low adhesion pattern LAP may be defined in the second electrode CT. The second electrode CT has low adhesion with respect to the low adhesion pattern LAP. Thus, in a process of forming the second electrode CT, the second electrode CT may not be stably disposed on the low adhesion pattern LAP. Thus, the opening OP_CT corresponding to the low adhesion pattern LAP may be defined in the second electrode CT, and the second electrode CT may be removed from the transmitting part TRP.

In an embodiment of the invention, the transmitting part TRP may further include the low adhesion pattern LAP to prevent the second electrodes CT and CTt from being disposed on the transmitting part TRP. Thus, the second electrode CT may be stably removed from a predetermined area without a separate patterning process.

In an embodiment of the invention, since the second electrode CT is removed from the transmitting part TRP, the transmitting part TRP may have a transmittance greater than that of the emitting part EMP. Thus, as the transmitting part TRP is disposed in the second area TA, the second area TA may have a transmittance greater than that of the first area EA.

In an alternative embodiment, as illustrated in FIG. 3C, the emitting part EMP may include a light emitting element EE-1 having a different laminated structure. The light emitting element EE-1 may further include charge control layers CCL1 and CCL2 when compared to the light emitting element EE illustrated in FIG. 3B. The charge control layers CCL1 and CCL2 include a first charge control layer CCL1 and a second charge control layer CCL2.

The first charge control layer CCL1 is disposed between the first electrode AN and the emitting pattern EP. The first charge control layer CCL1 may include a hole injection region HL and a hole transport region HT. The first charge control layer CCL1 may be provided as a common layer over the entire surface of the display panel DP using an open mask.

The second charge control layer CCL2 is disposed between the emitting pattern EP and the second electrode CT. The second charge control layer CCL2 may include an electron injection region EL and an electron transport region ET. The second charge control layer CCL2 may be provided as a common layer over the entire surface of the display panel DP using an open mask.

Here, a portion of each of the first charge control layer CCL1 and the second charge control layer CCL2 may be removed from the transmitting part TRP-1. In an embodiment, an opening OP_ET corresponding to the transmitting part TRP-1 is defined in the electron injection region EIL of the second charge control layer CCL2, for example. The electron injection region EIL may have a shape in which the transmitting part TRP-1 is not provided.

In an embodiment of the invention, one of the first charge control layer CCL1 and the second charge control layer CCL2, which is provided after forming the low adhesion pattern LAP, may be difficult to be stably provided by the low adhesion pattern LAP. Thus, one of the first charge control layer CCL1 and the second charge control layer CCL2, which is provided after forming the low adhesion pattern LAP, may be provided as a structure that is removed from the transmitting part TRP.

The electron injection region EIL or the second electrode CT may have a low light transmittance. The electron injection region EIL or the second electrode CT has a light transmittance less than that of the base substrate BS. In an embodiment of the invention, since the electron injection region EIL or the second electrode CT is removed from the transmitting part TRP or TRP-1, the transmitting part TRP or TRP-1 may have a light transmittance greater than that of the emitting part ERP.

As illustrated in FIGS. 3A to 3C, the display panel DP in an embodiment of the invention includes a transmitting part TRP or TRP-1 disposed in the second area TA. The transmitting part TRP or TRP-1 may include a low adhesion pattern LAP. The low adhesion pattern LAP has low adhesion with respect to layers having a low light transmittance among the layers disposed on the low adhesion pattern LAP such as the electron injection region EIL or the second electrode CT. Thus, the electron injection region EIL or the second electrode CT may be easily removed from the transmitting part TRP or TRP-1 without a separate patterning process to improve the light transmittance of the second area TA and simplify the process.

Figure 4A:
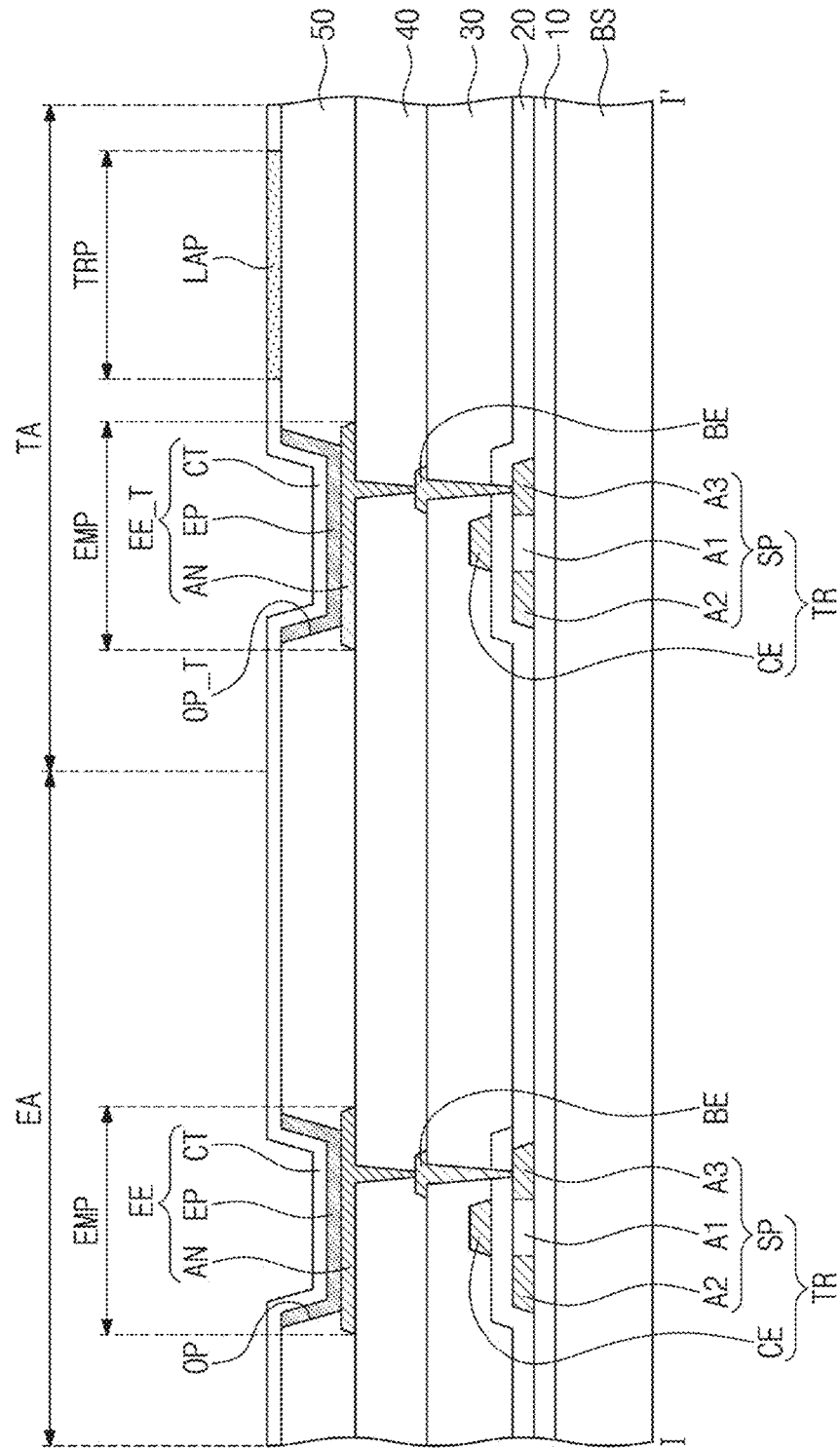
FIGS. 4A to 4C are cross-sectional views of an embodiment of the display panel according to the invention.
Figure 4B:
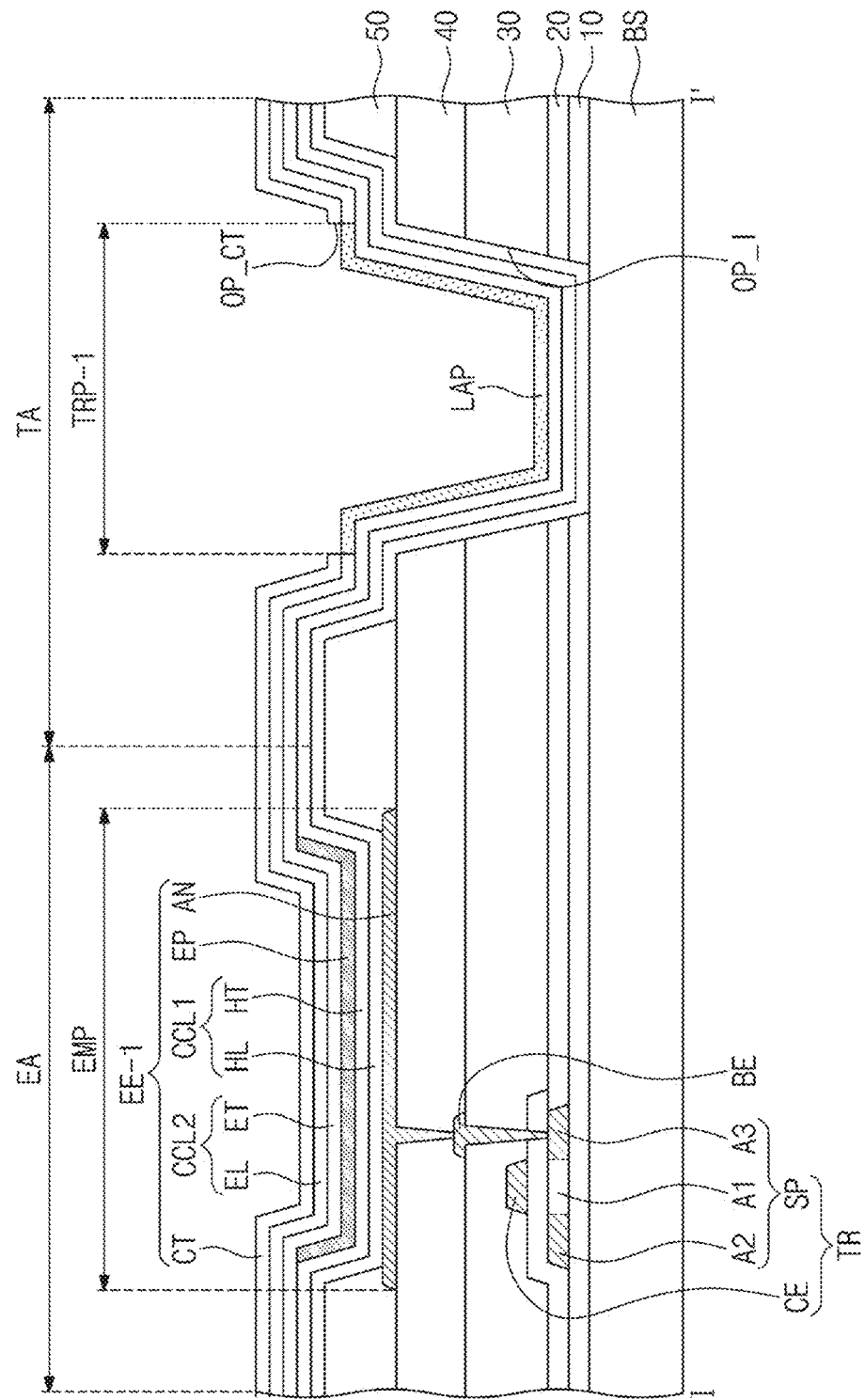
Figure 4C:
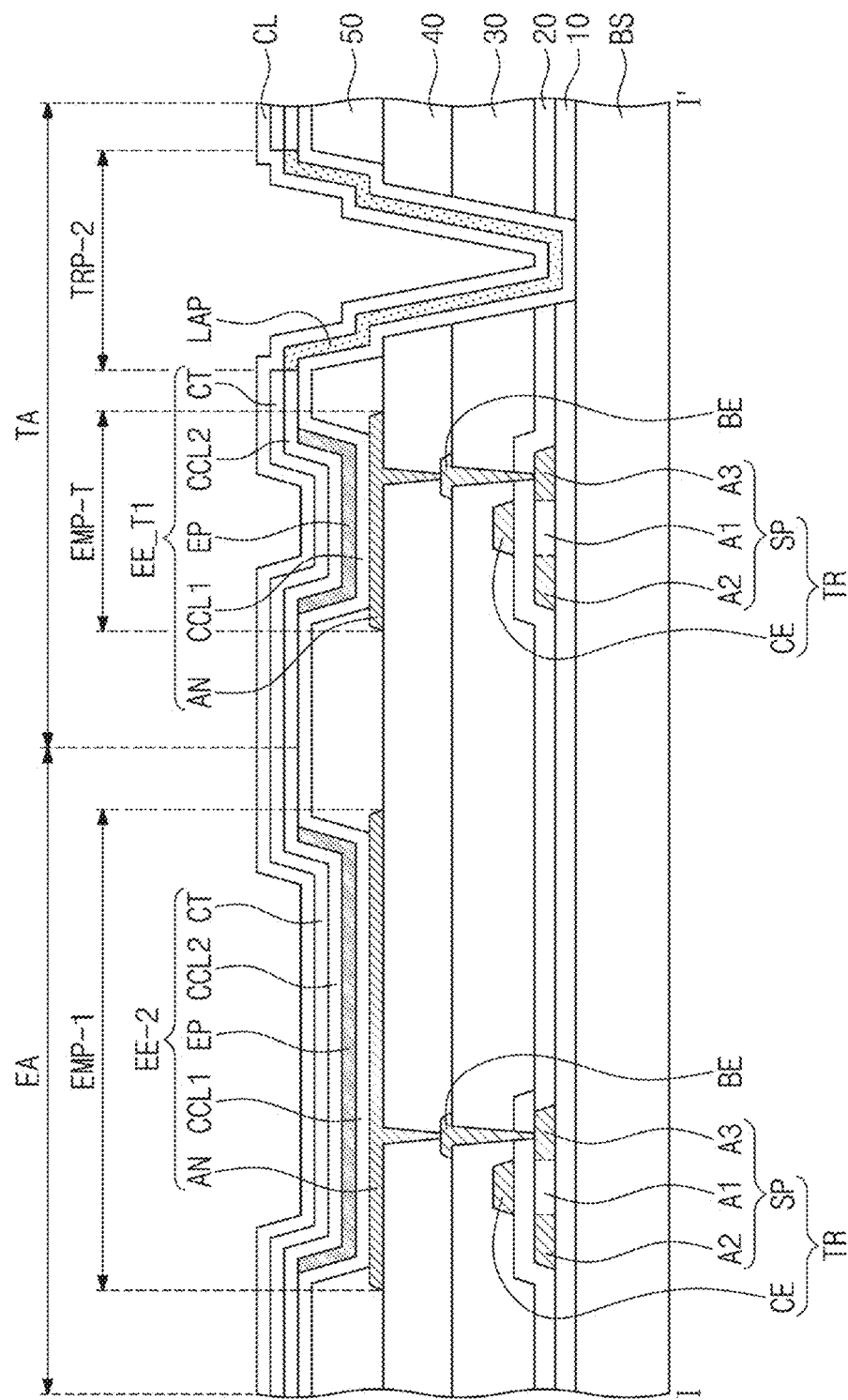

FIGS. 4A to 4C are cross-sectional views of an embodiment of the display panel according to the invention. In FIGS. 4A to 4C, an area corresponding to FIG. 3B is illustrated for easy description. Hereinafter, an embodiment of the invention will be described with reference to 4A to 4C.

The same reference numeral may be given to components that are the same as those of FIGS. 1 to 3B, and their detailed descriptions will be omitted.

As illustrated in FIG. 4A, the emitting part EMP and the transmitting part TRP may be disposed in the second area TA. The emitting part EMP is disposed in the first area EA and the second area TA, and the transmitting part TRP is disposed in the second area TA. The emitting part EMP disposed in the second area TA includes a light emitting element EE_T disposed in the opening OP_T defined in the second area TA. The light emitting element EE_T may have substantially the same structure as the light emitting element EE disposed in the first area EA.

Since the transmitting part TRP includes the low adhesion pattern LAP, the transmitting part TRP may not include a layer disposed on the low adhesion pattern LAP such as the second charge control layer CCL2 and the second electrode CT. Thus, the second area TA may include the emitting part EMP and the transmitting part TRP at the same time without a separate process for removing the second charge control layer CCL2 or the second electrode CT.

In an alternative embodiment, as illustrated in FIG. 4B, the transmitting part TRP-1 may be directly disposed on the base substrate BS. The first to fifth insulating layers 10 to 50 may be removed from the area corresponding to the transmitting part TRP-1. In this embodiment, a predetermined opening OP_I exposing the base substrate BS is defined in the first to fourth insulating layers 10 to 40, and a transmitting part TRP-1 is disposed in the opening OP_I. The fifth insulating layer 50 does not overlap the openings OP_I defined in the insulating layers. In an embodiment of the invention, since the plurality of insulating layers is removed from the second area TA, the transmitting part TRP-1 may have an improved transmittance.

In an alternative embodiment, as illustrated in FIG. 4C, as emitting part EMP-1 disposed in the first area EA and an emitting part EMP-T disposed in the second area TA may have different sizes. In this embodiment, a transmitting part TRP-2 is illustrated as being disposed on the exposed base substrate BS by removing a portion of the insulating films 10 to 50, like the transmitting part TRP-1 illustrated in FIG. 4B.

A light emitting element EE-2 provided in the emitting part EMP-1 of the first area EA includes a first electrode AN, a first charge control layer CCL1, an emitting pattern EP, a second charge control layer CCL2, and a second electrode CT. A light emitting element EE-T1 provided in the emitting part EMP-T of the second area TA may have a layer structure corresponding to the light emitting element EE-2 of the first area EA. However, a size of a planar area of the light emitting element EE-T1 of the second area TA may be different from that of the light emitting element EE-2 of the first area EA. In this embodiment, the light emitting element EE-T1 of the second area TA is illustrated to have a size less than that of the light emitting element EE-2 of the first area EA. However, the invention is not limited thereto. In an embodiment, the light emitting element EE-T1 of the second area TA may have a size greater than that of the light emitting element EE-2 of the first area EA, for example. The display panel may further include a capping layer CL. The capping layer CL may be provided in an integrated shape overlapping both the first area EA and the second area TA. The capping layer CL is disposed on the light emitting element EE-T1 to cover a top surface of the second electrode CT. A top surface of the low adhesion pattern LAP may be covered by the capping layer CL. The capping layer CL may include an insulating material. The capping layer CL may be optically transparent. In an embodiment of the invention, since the low adhesion pattern LAP is provided in the second area TA, the transmitting part TRP-2 having a transmittance greater than that of the emitting part EMP-1 may be easily provided. Also, in an embodiment of the invention, the second area TA may be constituted by only the transmitting part TRP-2 or constituted by a combination of the transmitting part TRP-2 and the emitting part EMP-T, and also, the emitting part EMP-1 in the first area EA and the emitting part EMP-T in the second area TA may have various sizes. Thus, in the display panel in an embodiment of the invention, the transmittance of the second area TA may be variously designed, but is not limited to any particular embodiment.

Figure 5A:
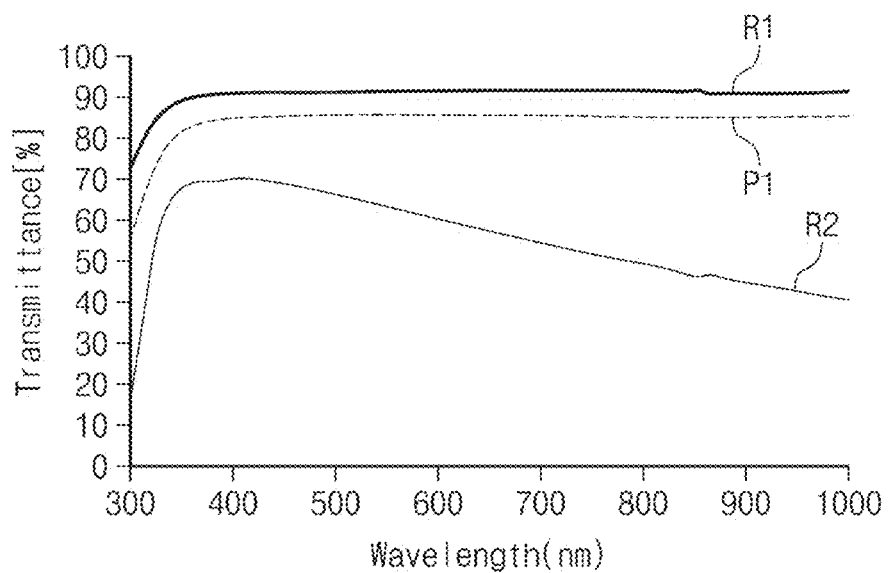
FIGS. 5A and 5B are graphs illustrating transmittance depending on a wavelength.
Figure 5B:
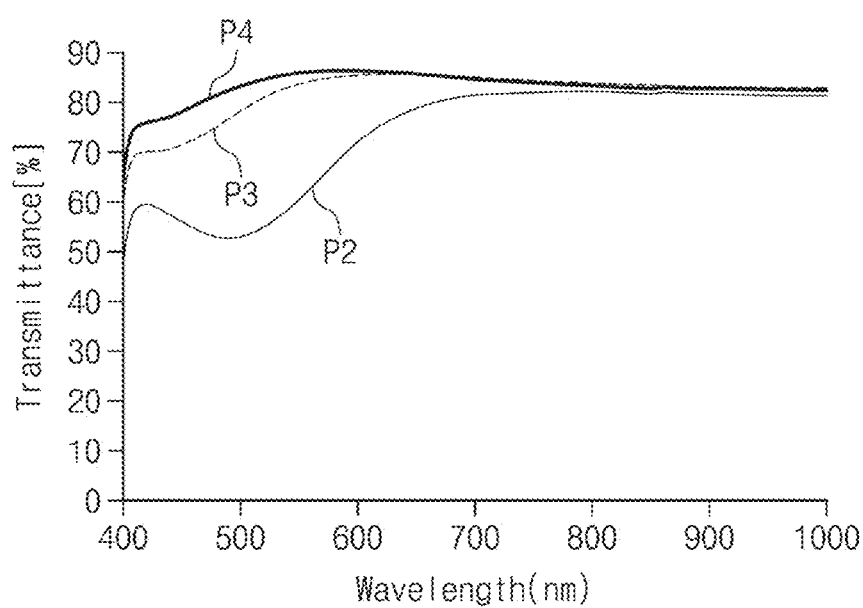

FIGS. 5A and 5B are graphs of transmittance depending on a wavelength. FIG. 5A illustrates results obtained by comparing a light transmittance according to a wavelength of a transmitting part P1 in an embodiment of the invention to a light transmittance according to a wavelength of comparative examples R1 and R2. A light transmittance according to a wavelength in the first comparative example R1 is illustrated as a graph showing a light transmittance of the glass substrate, and a light transmittance according to a wavelength in the second comparative example R2 is illustrated as light transmittance according to a wavelength of an electrode. The electrode corresponds to the second electrode CT (refer to FIG. 3B), includes an alloy of aluminum and magnesium, and has a thickness of about 90 angstroms (Å).

The transmitting part P1 was provided by forming a second electrode on the low adhesion pattern LAP (refer to FIG. 3B). The second electrode was provided at the same formation speed and formation time as in the second comparative example R2.

Referring to FIG. 5A, the light transmittance in the second comparative example R2 rapidly decreases as the wavelength increases when compared to the light transmittance in the first comparative example R1. In contrast, the light transmittance of the transmitting part P1 is less by about 5% than that in the first comparative example R1 and substantially the same as in the first comparative example R1, i.e., is maintained at a light transmittance of 80% or more.

In an embodiment of the invention, when an electrode is disposed on the low adhesion pattern LAP, it is difficult to form the electrode on the low adhesion pattern LAP due to the low adhesion of the low adhesion pattern LAP. Thus, the transmitting part P1 may be constituted by only the low adhesion pattern LAP without the electrode or may have a structure in which an extremely thin electrode layer is disposed on the low adhesion pattern LAP. In an embodiment of the invention, since the light transmittance of the transmitting part P1 may have substantially the same light transmittance as the low adhesion pattern LAP, an optically transparent area such as transparent glass may be easily provided in the display panel.

FIG. 5B illustrates light transmittances according to wavelengths in embodiments P2, P3, and P4 in which the number of times of formation varies. In the second embodiment P2, after forming the low adhesion pattern LAP once, the second charge control layer CCL2 (refer to FIG. 4C) and a second electrode CT (refer to FIG. 4A) were sequentially provided. In the third embodiment P3, after forming the low adhesion pattern LAP twice, the second charge control layer CCL2 and a second electrode CT were sequentially provided. In the fourth embodiment P4, after forming the low adhesion pattern LAP three times, the second charge control layer CCL2 and a second electrode CT were sequentially provided. Each of the second charge control layer CCL2 and the second electrode CT was provided under the same formation speed and the same formation time.

Referring to FIG. 5B, in a short wavelength range of about 700 nanometers (nm) or less, the light transmittance is the lowest in the second embodiment P2 and is the highest in the fourth embodiment P4. That is, it is seen that the light transmittance in the embodiment increases as the number of times of formation of the low adhesion pattern LAP increases. The increase in number of times of formation of the low adhesion pattern LAP corresponds to an increase in thickness of the low adhesion pattern LAP. Thus, as the thickness of the low adhesion pattern LAP increases, the formation of the second charge control layer CCL2 or the second electrode CT on the low adhesion pattern LAP may be easily suppressed.

The increase in thickness of the low adhesion pattern LAP may correspond to an increase in content of fluorine included in the low adhesion pattern LAP. Thus, in an embodiment of the invention, as the content of fluorine in the low adhesion pattern LAP increases, the light transmittance of the area in which the low adhesion pattern LAP is disposed may increase, and the light transmittance of the corresponding area may be easily controlled through the low adhesion pattern LAP.

FIGS. 6A to 6D are cross-sectional views illustrating an embodiment of a portion of the display panel according to the invention. FIGS. 6A to 6D schematically illustrate layers constituting the emitting part and the transmitting part. Hereinafter, the invention will be described with reference to FIGS. 6A to 6D. The same reference numeral may be given to components that are the same as those of FIGS. 1 to 5B, and their detailed descriptions will be omitted.

FIGS. 6A to 6D illustrate an emitting part EMP-A having a common structure and transmitting parts TRP-A, TRP-B, TRP-C, and TRP-D having different structures. The emitting part EMP-A includes a light emitting element EE T1 and a capping layer CL. The light emitting element EE_T1 may be disposed in the first area EA (refer to FIGS. 2 to 4C) or may be disposed in the first area EA and the second area TA (refer to FIGS. 2 to 4C).

The light emitting element EE_T1 includes a first electrode ANt, a first charge control layer CCL1t, an emitting pattern EPt, a second charge control layer CCL2t, and a second electrode CTt. The first charge control layer CCL1t is illustrated as a laminated structure of two layers including a hole injection layer HL and a hole transport layer HT. The second charge control layer CCL2t is illustrated as a laminated structure of two layers including an electron transport layer ET and an electron injection layer EL.

Figure 6A:
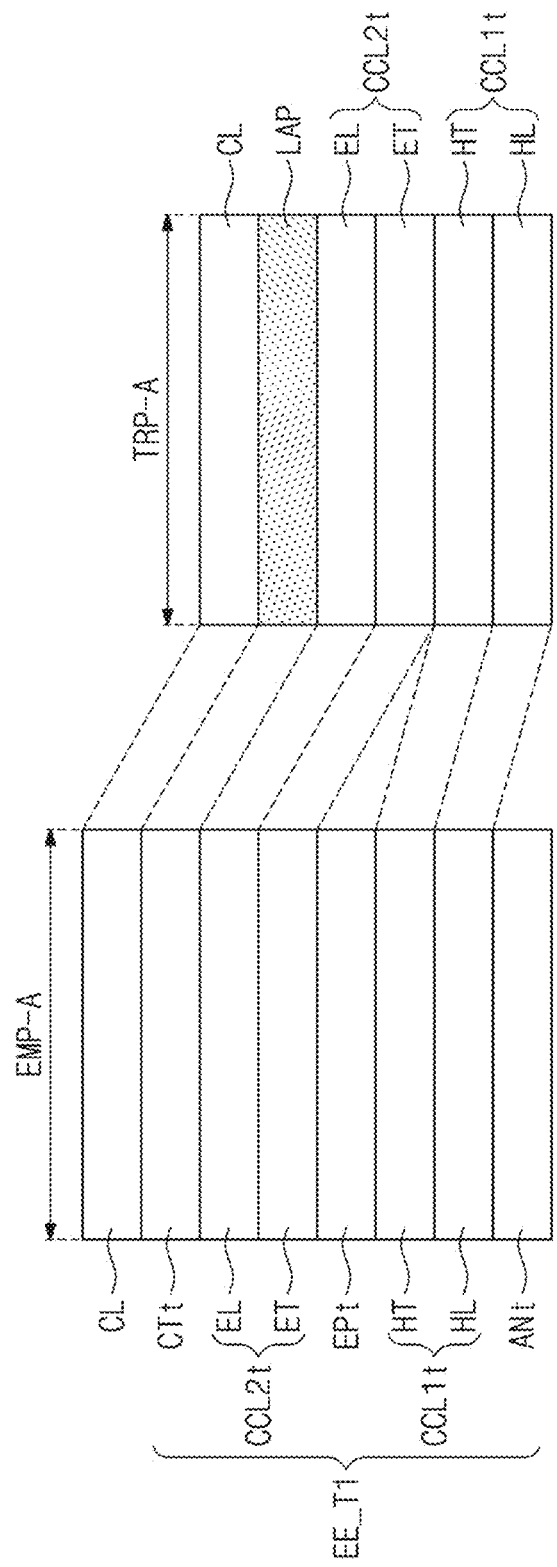

As illustrated in FIG. 6A, the transmitting part TRP-A may include a first charge control layer CCL1t, a second charge control layer CCL2t, a low adhesion pattern LAP, and a capping layer CL. The first charge control layer CCL1t, the second charge control layer CCL2t, and the capping layer CL are provided in an integrated shape connected to the emitting part EMP-A.

The low adhesion pattern LAP is disposed between the second charge control layer CCL2t and the capping layer CL. Due to the low adhesion of the low adhesion pattern LAP, it is difficult to form the second electrode CTt of the emitting part EMP-A on the low adhesion pattern LAP. Thus, even when the second electrode CTt is provided commonly to each of the emitting part EMP-A and the transmitting part TRP-A, the second electrode CTt is selectively provided in only the emitting part EMP-A and is not provided in the transmitting part TRP-A.

The low adhesion pattern LAP has low adhesion with respect to a layer including a metal. The second electrode CTt including a metal is difficult to be stably disposed on the low adhesion pattern LAP. The capping layer CL in an embodiment of the invention does not include a metal. Thus, the capping layer CL is stably disposed on the low adhesion pattern LAP to cover the top surface of the low adhesion pattern LAP. In an embodiment of the invention, since the low adhesion pattern LAP is disposed in the transmitting part TRP-A, the second electrode CTt may be provided in an area except for the transmitting part TRP-A without adding a separate mask or adding a patterning process.

Figure 6B:
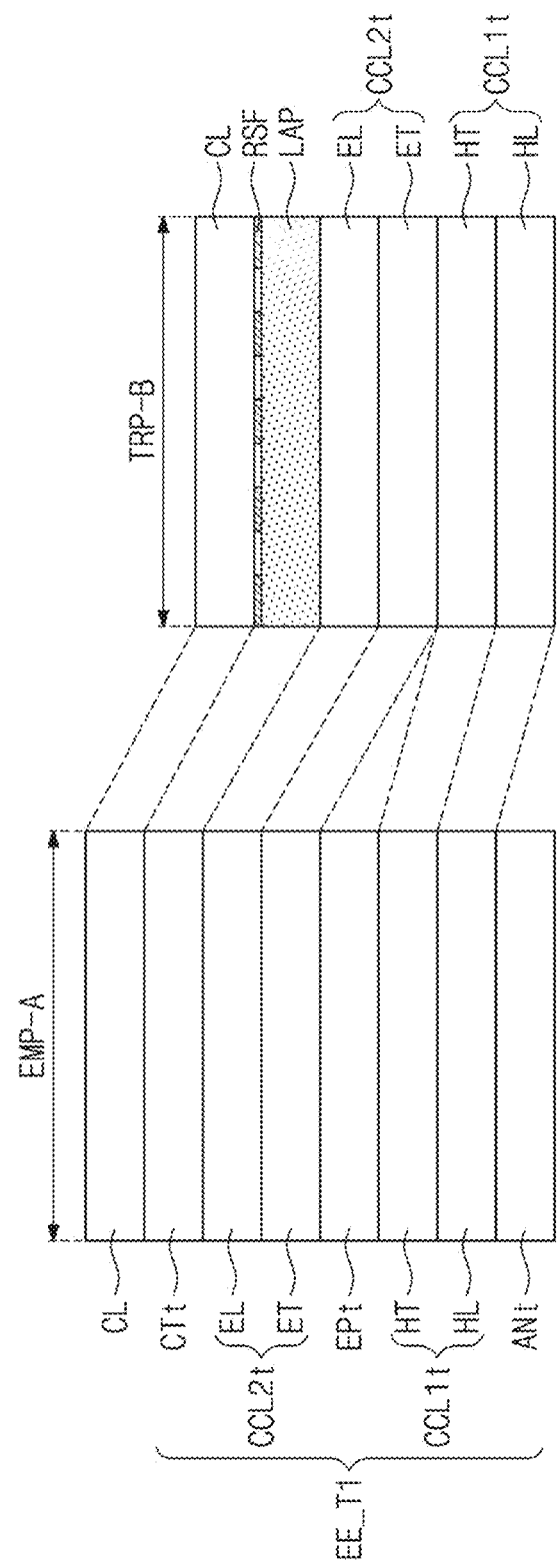

As illustrated in FIG. 6B, the transmitting part TRP-B may further include a residual part RSF. The residual part RSF is disposed on the low adhesion pattern LAP, and the capping layer CL covers the residual part RSF. The residual part RSF may include the same material as that of the second electrode CTt. The residual part RSF may have a relatively thin thickness when compared to the second electrode CTt. In an embodiment, the thickness of the residual part RSF may be about 1 Å or less, for example. In an alternative embodiment, the residual part RSF may expose at least a portion of the top surface of the low adhesion pattern LAP. Here, the residual part RSF may be disposed on the low adhesion pattern LAP in the form of grains.

The residual part RSF may be provided by allowing a portion of the second electrode CTt to partially remain on the top surface of the low adhesion pattern LAP as the formation speed of the second electrode CTt is quicker, or the formation time increases. Thus, the residual part RSF may have an extremely thin thickness that is enough to cover all of the top surface of the second electrode CTt or may be provided by a residue that partially exposes the top surface of the second electrode CTt.

As illustrated in FIG. 6C, a transmitting part TRP-C may include a first charge control layer CCLt1, an electron transport layer ET, a low adhesion pattern LAP, a residual layer RSF-1, and a capping layer CL. The low adhesion pattern LAP is disposed between the electron transport layer ET and the capping layer CL. Thus, the electron injection layer EL and the second electrode CTt may not be provided in a transmitting part TRP-C.

The residual part RSF-1 may include the same material as at least one of the electron injection layer EL and the second electrode CTt. The residual part RSF-1 may be provided by allowing a portion of the electron injection layer EL and/or a portion of the second electrode CTt to partially remain on the top surface of the low adhesion pattern LAP. The residual part RSF-1 has a thickness less than that of the electron injection layer EL or the second electrode CTt. As a result, a light transmittance of the transmitting part TRP-C may be greater than that of the emitting part EMP-A.

In this embodiment, the residual part RSF-1 is illustrated as a layer covering the electron transport layer ET entirely. However, this is merely an example. In another embodiment, as illustrated in FIG. 6C, the residual part RSF-1 may be provided in the form of a grain that exposes a portion of the electron transport layer ET according to a residual degree, for example, but is not limited to any particular embodiment.

Figure 6D:
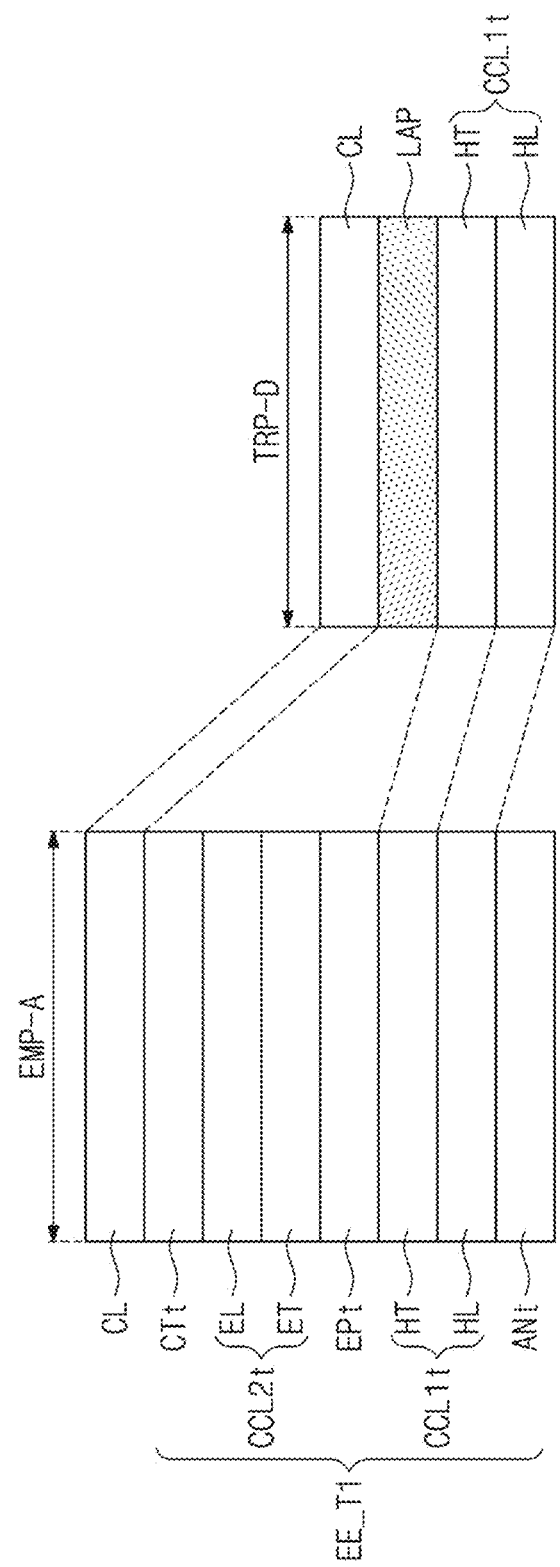

As illustrated in FIG. 6D, a transmitting part TRP-D may include a first charge control layer CCL1t, a low adhesion pattern LAP, and a capping layer CL. The low adhesion pattern LAP is directly disposed on the first charge control layer CCL1t, and the capping layer CL is directly disposed on the low adhesion pattern LAP. The transmitting part TRP-D may not include the emitting pattern EPt, the second charge control layer CCL2t, and the second electrode CTt and thus may have a light transmittance greater than that of the emitting part EMP-A.

FIGS. 7A to 7G are schematic plan views illustrating an embodiment of one area of the display panel according to the invention. FIGS. 7A to 7E illustrate partially enlarged views of an area including the second area TA of the area illustrated in FIG. 3A in the display panels DP1, DP2, DP3, DP4, and DP5. Hereinafter, an embodiment of the invention will be described with reference to FIGS. 7A to 7E.

Figure 7A:
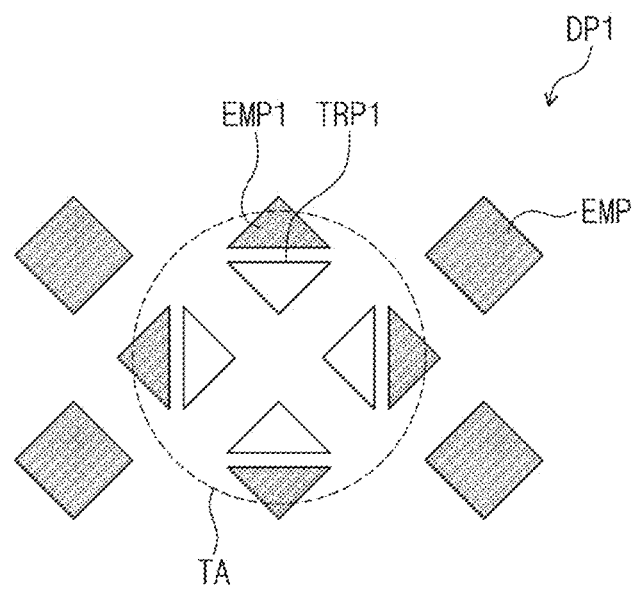
FIGS. 7A to 7G are schematic plan views illustrating an embodiment of one area of the display panel according to the invention.

As illustrated in FIG. 7A, a display panel DP1 includes an emitting part EMP and a transmitting part TRP1. The first area EA (refer to FIGS. 2 to 4C) includes an emitting part EMP. The emitting part EMP is illustrated to have a size similar to that of the emitting part EMP of FIG. 3A. The emitting part EMP is illustrated in a substantially planar shape of an emitting pattern EP (refer to FIG. 3B).

The second area TA includes a transmitting part TRP1 and an emitting part EMP1. The transmitting part TRP1 is illustrated to have substantially the same size as the emitting part EMP1. The transmitting part TRP1 is illustrated in a planar shape of the low adhesion pattern LAP (refer to FIG. 6A to 6D), and the emitting part EMP1 is illustrated in a planar shape of the emitting pattern EPt (refer to FIGS. 6A to 6D).

The transmitting part TRP1 of the second area TA may be disposed adjacent to a center of the second area TA, and the emitting part EMP1 may be disposed adjacent to an edge of the second area TA. Thus, as being closer to the center of the second area TA, a light transmittance may be relatively high.

Figure 7B:
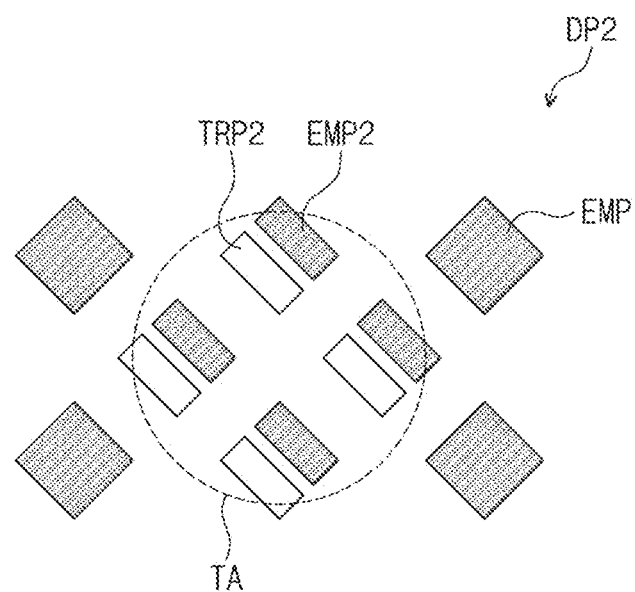

In an alternative embodiment, as illustrated in FIG. 7B, the display panel DP2 includes an emitting part EMP disposed in the first area EA, an emitting part EMP2 disposed in the second area TA, and a transmitting part TRP2. The display panel DP2 may include a rectangular transmitting part TRP2 and a rectangular emitting part EMP2. The transmitting part TRP2 and the emitting part EMP2 disposed in the second area TA may have the same size, and each of the transmitting part TRP2 and the emitting part EMP2 disposed in the second area TA may have a size different from that of the emitting part EMP in the first area EA. In this embodiment, each of the transmitting part TRP2 and the emitting part EMP2 may have a size less than that of the emitting part EMP disposed in the first area EA.

Figure 7C:
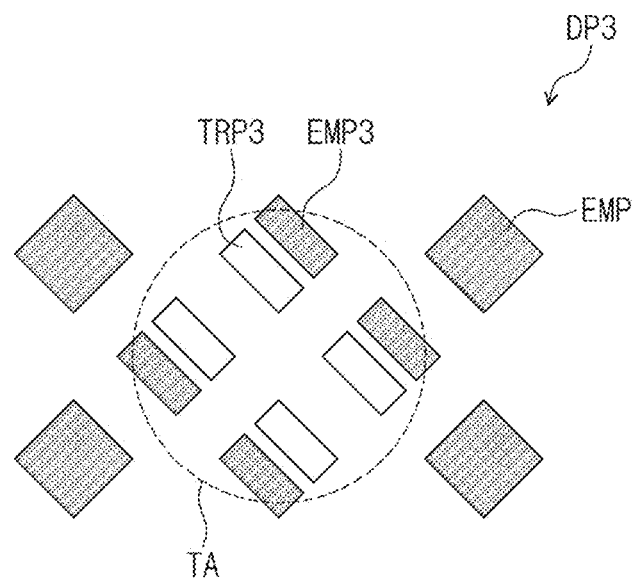

In an alternative embodiment, as illustrated in FIG. 7C, the display panel DP3 may include a transmitting part TRP3 and an emitting part EMP3 arranged in a different order in the second area TA. The transmitting part TRP3 may be disposed adjacent to a center of the second area TA, and the emitting part EMP3 may be disposed adjacent to an edge of the second area TA. Thus, as being closer to the center of the second area TA, a light transmittance may be relatively high. In an embodiment of the invention, since both the emitting part EMP3 and the transmitting part TRP3 may be disposed in the second area TA, the second area TA through which light is transmitted while an image is displayed may be provided.

Figure 7D:
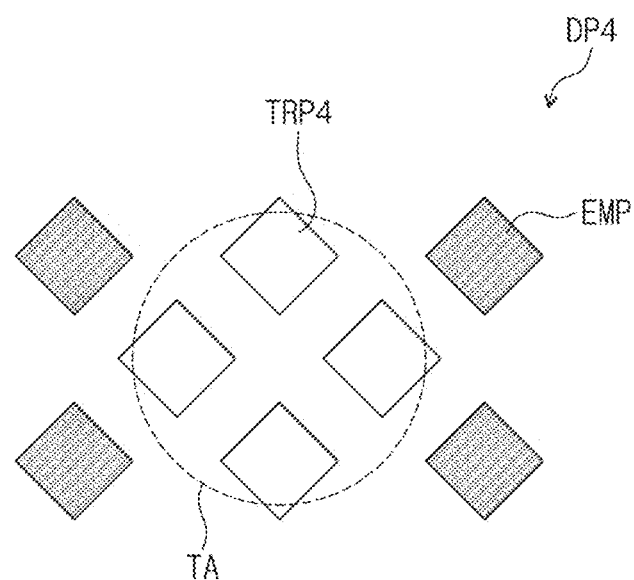
Figure 7E:
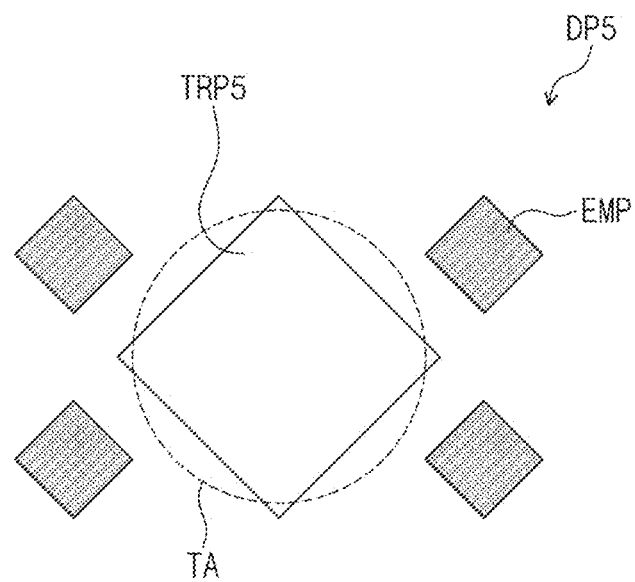

In an alternative embodiment, as illustrated in FIG. 7D, the display panel DP4 may have a structure in which only the transmitting part TRP4 is disposed in the second area TA. The emitting part EMP may be spaced apart from the second area TA to improve the light transmittance of the second area TA. In an alternative embodiment, as illustrated in FIG. 7E, the display panel DP5 may include one transmitting part TRP5 in the second area TA. The transmitting part TRP5 may have a size overlapping the entire second area TA, and also, the transmitting part TRP5 may have a size overlapping the second area TA corresponding thereto. Here, a size of a planar area of the transmitting part TRP5 is greater than that of the emitting part EMP. The display panel DP5 includes a single transmitting part TRP5 to simplify a structure of the second area TA.

Figure 7F:
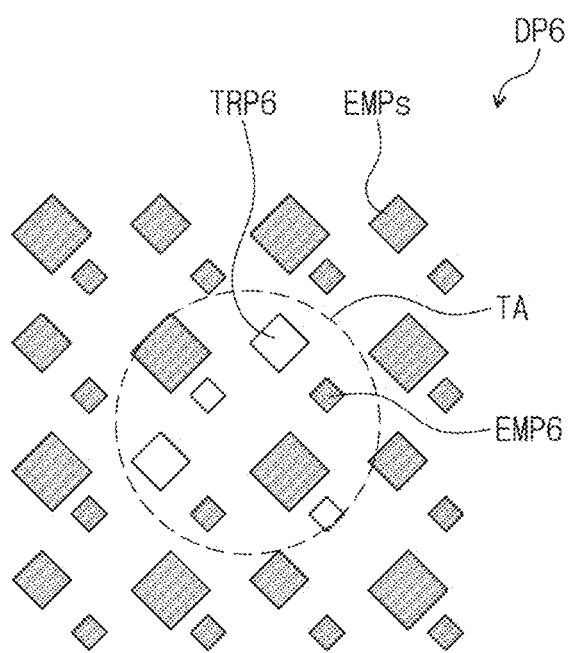

In an alternative embodiment, as illustrated in FIG. 7F, in the display panel DP6, the emitting part EMP6 disposed in the second area TA may have the same shape as the emitting part EMPs having at least two different shapes and disposed in the first area EA. The emitting part EMP6 disposed in the second area TA has the same shape as a portion of the emitting parts EMPs disposed in the first area EA, and the transmitting part TRP6 has the same shape as the other portion of the emitting parts EMPs. The emitting parts EMPs may correspond to the sub pixels, and the transmitting part TRP6 may be provided by disposing the low adhesion pattern on a portion of the sub pixels.

Figure 7G:
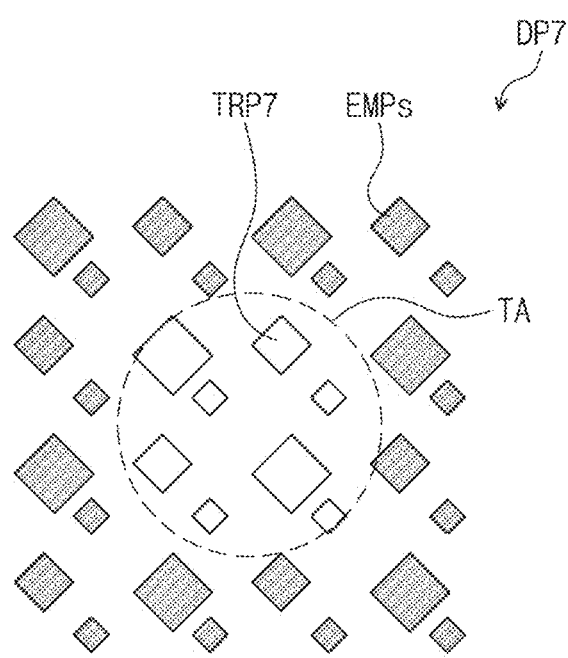

In an alternative embodiment, as illustrated in FIG. 7G, in the display panel DP7, only the transmitting part TRP7 may be disposed in the second area TA. The transmitting part TRP7 may be disposed in the same shape and arrangement as the emitting parts EMPs disposed in the first area EA. Thus, the same mask as a mask for forming the emitting pattern may be used to form the low adhesion pattern for forming the transmitting part TRP7. However, this is merely an example. In another embodiment, the transmitting part TRP7 may have a shape different from that of each of the emitting parts EMPs and may be provided through different processes, but is not limited to any particular embodiment, for example.

FIGS. 8A to 8G are cross-sectional views illustrating an embodiment of a method for manufacturing a display panel according to the invention. FIGS. 8A to 8G illustrate an area in which one emitting part EMP-A and one transmitting part TRP-A are disposed. Hereinafter, an embodiment of the invention will be described with reference to FIGS. 8A to 8G. The same reference numerals are assigned to the same configurations as those described in FIGS. 1 to 7E, and duplicated description will be omitted.

Figure 8A:
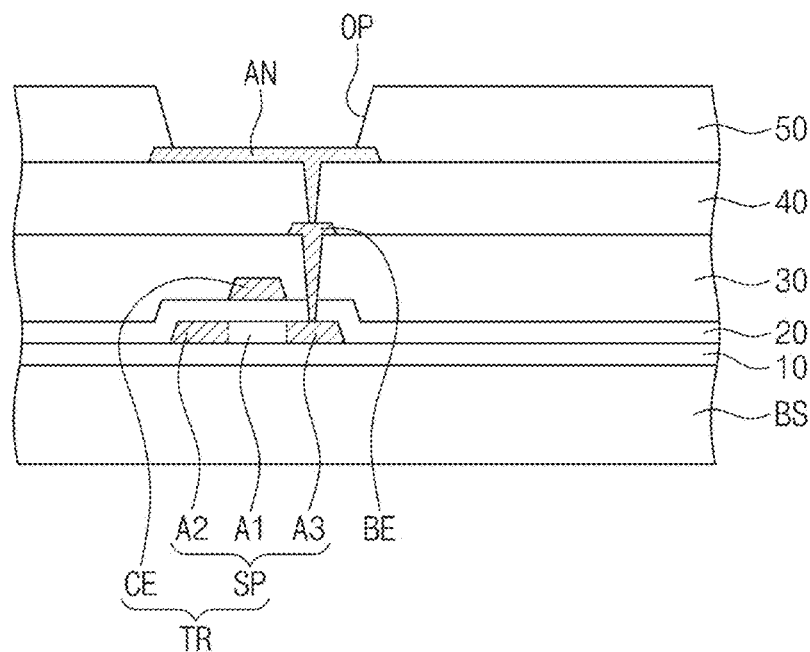
FIGS. 8A to 8G are cross-sectional views illustrating an embodiment of a method for manufacturing a display panel according to the invention.

As illustrated in FIG. 8A, a thin film transistor TR, a connection electrode BE, a first electrode AN, and a fifth insulating layer 50 are disposed on a base substrate BS. The thin film transistor TR may be provided through a plurality of deposition/patterning processes. The connection electrode BE may be provided by defining holes passing through a second insulating layer 20 and a third insulating layer 30, and then patterning a conductive layer disposed on the third insulating layer 30. The first electrode AN may be provided by defining a hole passing through a fourth insulating layer 40 and then patterning a conductive layer disposed on the fourth insulating layer 40.

A fifth insulating layer 50 is provided by depositing an insulating material on the fourth insulating layer 40 so that the first electrode AN is covered. Thereafter, an opening OP is defined in the fifth insulating layer 50 to expose at least a portion of the first electrode AN.

Figure 8B:
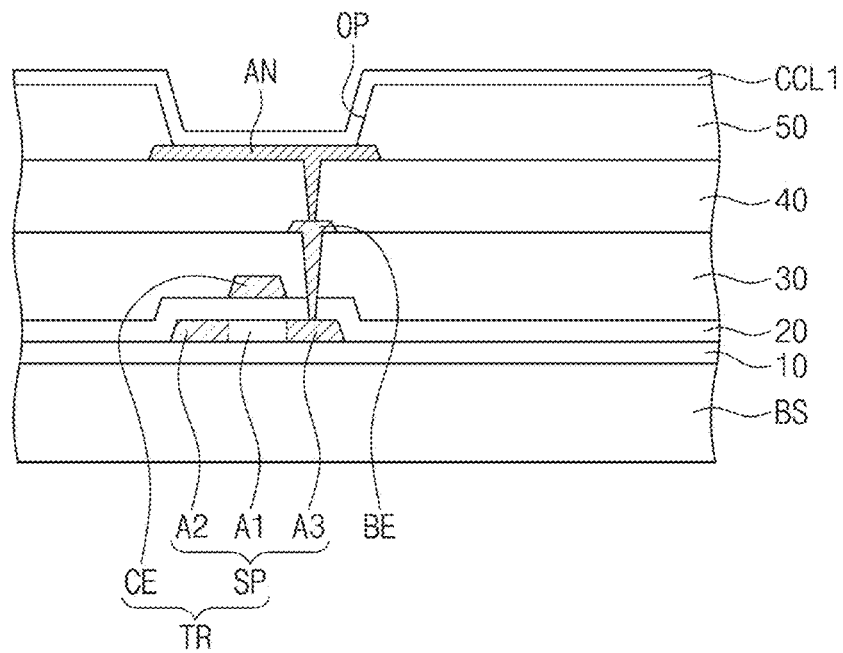

Thereafter, as illustrated in FIG. 8B, a first charge control layer CCL1 is provided. The first charge control layer CCL1 may be provided by depositing, coating, transferring, or printing an organic layer including a hole transport material and/or a hole injection material. The first charge control layer CCL1 may be provided as a single layer or a plurality of layers.

Figure 8C:
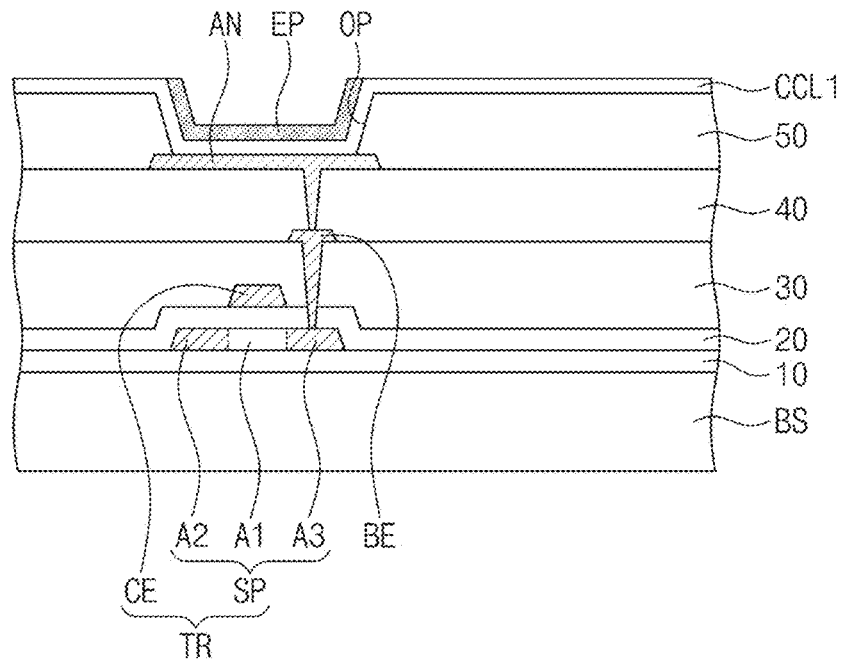

Thereafter, as illustrated in FIG. 8C, an emitting pattern EP is provided. The emitting pattern EP may be provided by depositing, coating, printing, transferring, or printing a fluorescent material or a phosphorescent material on an area corresponding to the opening OP. In an alternative embodiment, the emitting pattern EP may include an inorganic light emitting material such as quantum dots, nanorods, micro LEDs, and nano LEDs, but is not limited to any particular embodiment.

Figure 8D:
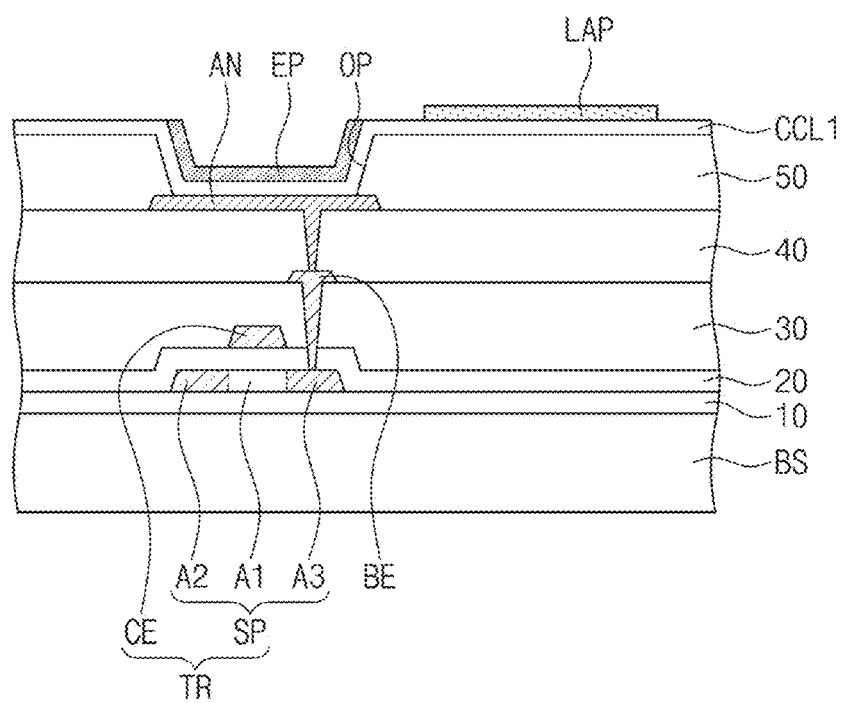

Thereafter, as illustrated in FIG. 8D, a low adhesion pattern LAP is provided. The low adhesion pattern LAP is disposed on the first charge control layer CCL1 so as to be spaced apart from the opening OP. The low adhesion pattern LAP may be spaced apart from the first electrode AN and the emitting pattern EP in a plan view.

The low adhesion pattern LAP includes fluorine. The low adhesion pattern LAP may be provided by depositing, printing, or coating a fluorine-based carbon compound. In an alternative embodiment, the low adhesion pattern LAP may be provided by forming a carbon compound pattern and then substituting a portion of hydrogen of the carbon compound with fluorine to form a fluorine-based carbon compound pattern.

Figure 8E:
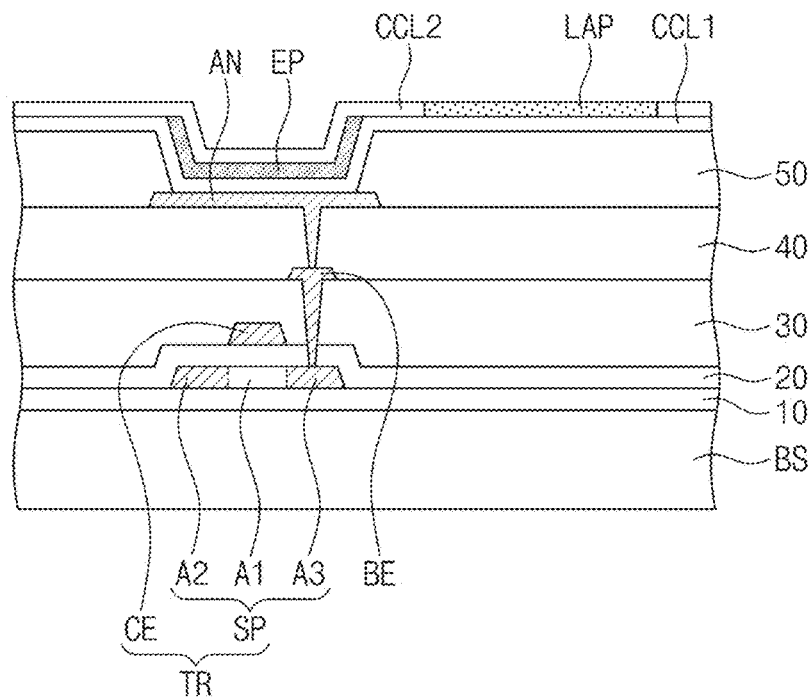

Thereafter, as illustrated in FIG. 8E, a second charge control layer CCL2 is provided. The second charge control layer CCL2 is disposed on the first charge control layer CCL1. The second charge control layer CCL2 may be provided by depositing, coating, transferring, or printing an organic material including an electron transport material and/or an electron injection material. The second charge control layer CCL2 is disposed on an entire surface of the base substrate BS.

Here, the organic material forming the second charge control layer CCL2 is also provided on a top surface of the low adhesion pattern LAP. The second charge control layer CCL2 includes a metal. Accordingly, the low adhesion pattern LAP has low adhesion with respect to the organic material forming the second charge control layer CCL2.

The organic material forming the second charge control layer CCL2 is difficult to be disposed on a surface of the low adhesion pattern LAP. Thus, the second charge control layer CCL2 may not be provided in the area in which the low adhesion pattern LAP is provided. An opening corresponding to the low adhesion pattern LAP may be defined in the second charge control layer CCL2.

Figure 8F:
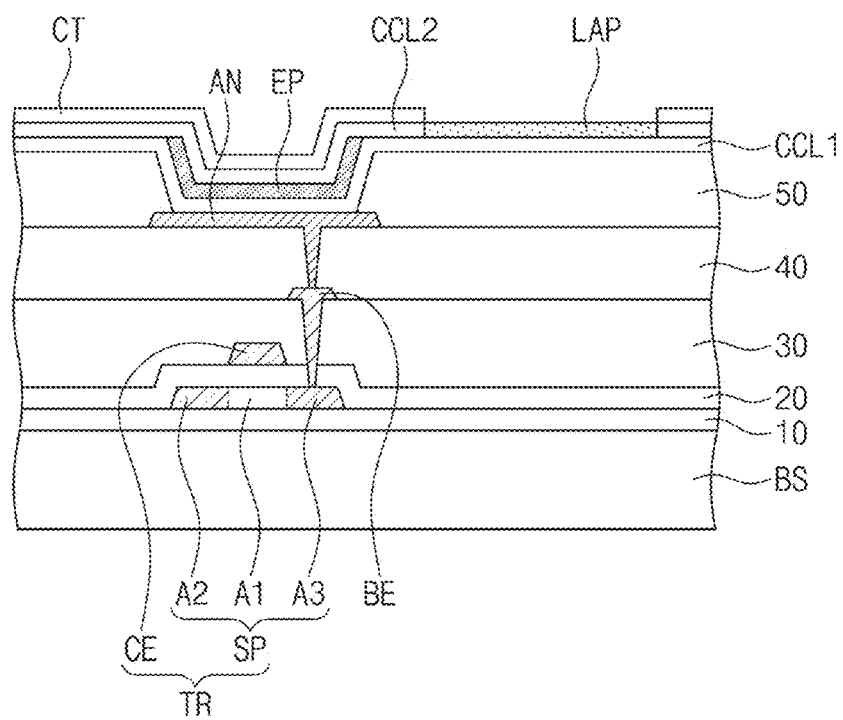
Figure 8G:
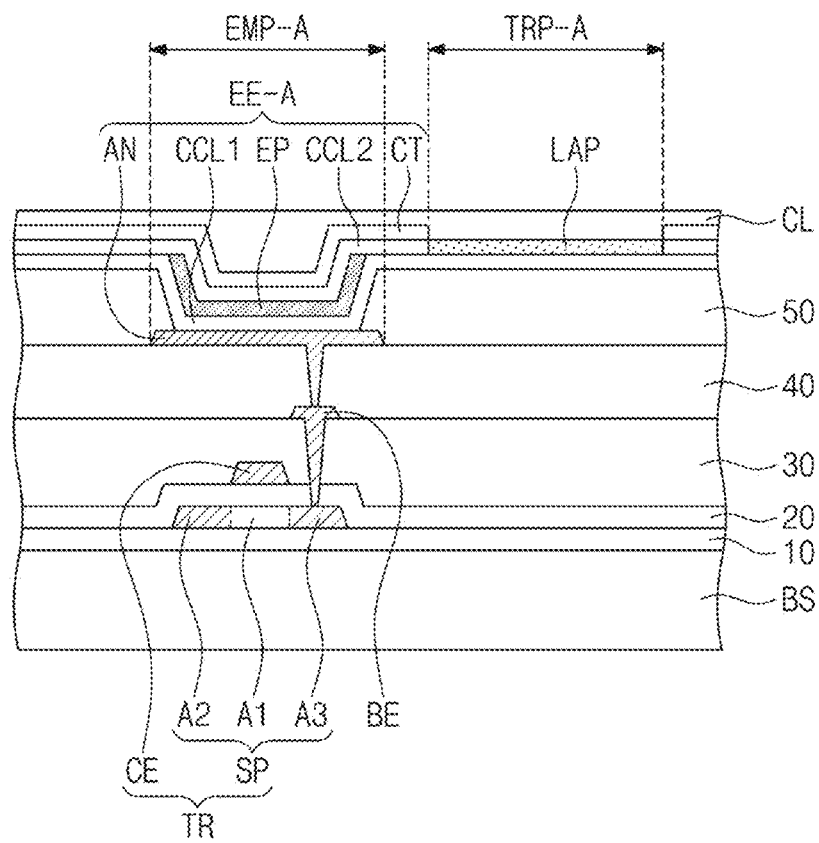

Thereafter, as illustrated in FIGS. 8F and 8G, a second electrode CT and a capping layer CL are sequentially provided to form a transmitting part TRP. As illustrated in FIG. 8F, the second electrode CT may be provided by depositing or coating a conductive material on the second charge control layer CCL2. The second electrode CT has low adhesion with respect to the low adhesion pattern LAP.

Thus, it is difficult to allow the conductive material provided on the low adhesion pattern LAP to stably remain on the low adhesion pattern LAP. The second electrode CT may be provided in a shape exposing the low adhesion pattern LAP. An opening may be defined in the second electrode CT in an area corresponding to the low adhesion pattern LAP.

Thus, as illustrated in FIG. 8G, the capping layer CL may cover a light emitting element EE-A and the low adhesion pattern LAP. The capping layer CL is commonly provided in the emitting part EMP-A and the transmitting part TRP-A. The capping layer CL may include a transparent insulating material. Thus, even when a mask or a separate process for removing a portion of the second charge control layer CCL2 or the second electrode CT overlapping the transmitting part TRP-A is not added, the transmitting part TRP may include the emitting part EMP-A including the light emitting element EE-A and the transmitting part TRP-A providing a transparent area at the same time. Thus, the process of manufacturing the display panel may be simplified, and the process cost may be reduced.

Figure 9A:
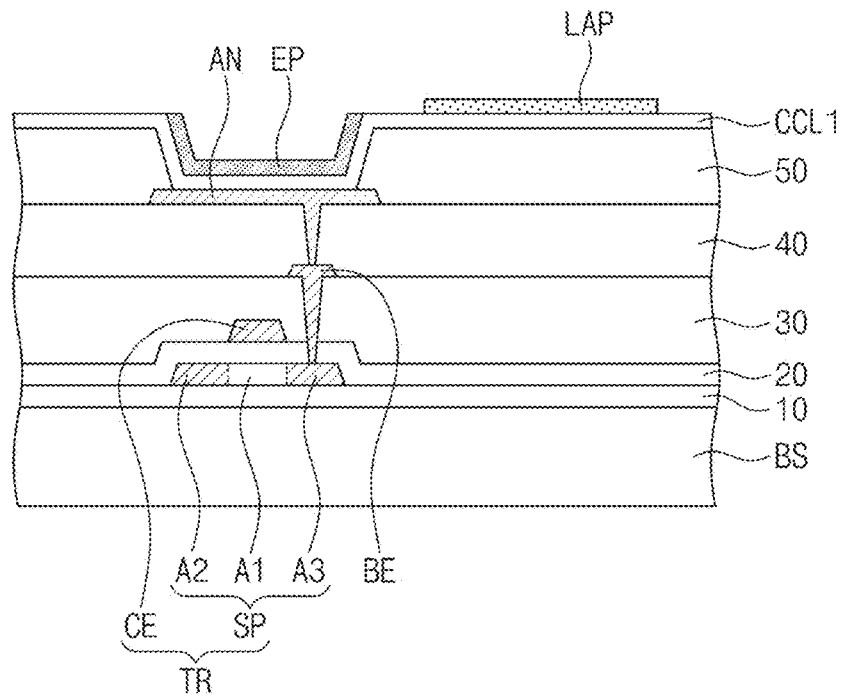
FIGS. 9A to 9C are cross-sectional views illustrating an embodiment of a method for manufacturing a display panel according to the invention.
Figure 9B:
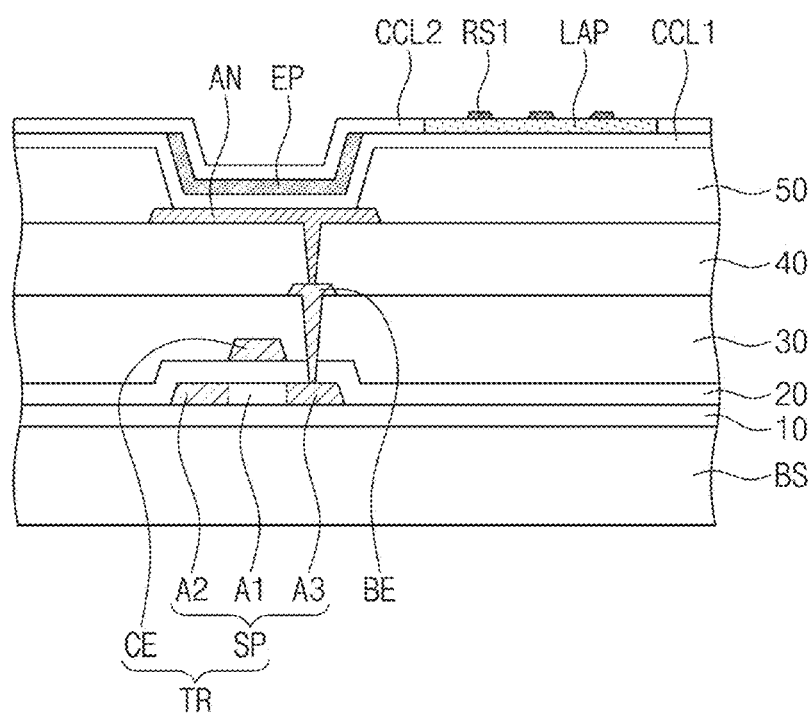
Figure 9C:
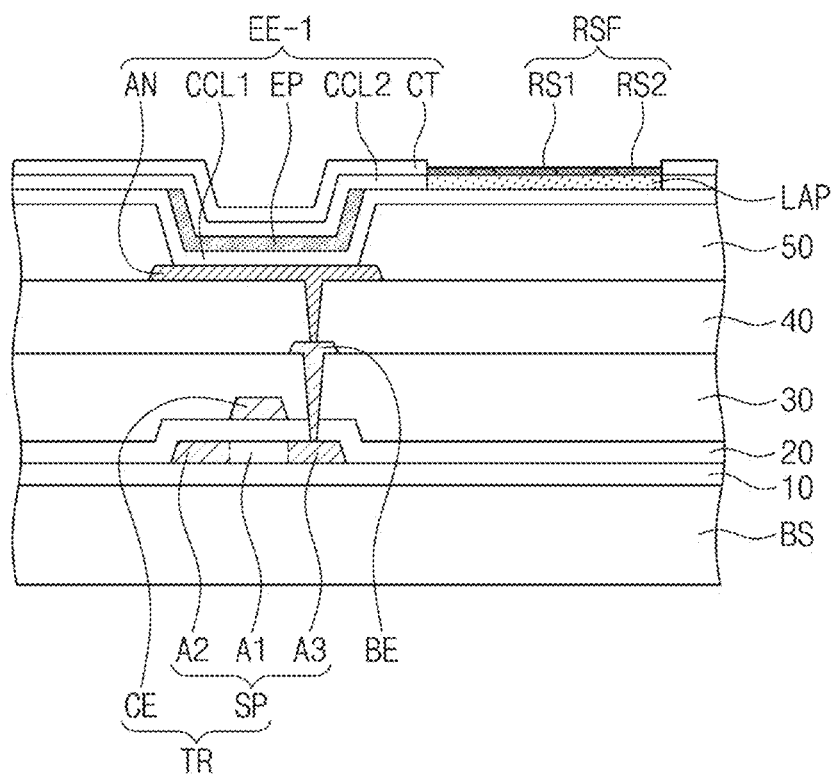

FIGS. 9A to 9C are cross-sectional views illustrating an embodiment of a method for manufacturing a display panel according to the invention. FIGS. 9A to 9C schematically illustrate a method of manufacturing a single transmission pixel. Hereinafter, the same reference numerals are assigned to the configurations described in FIGS. 1 to 8G, and duplicated description will be omitted.

As illustrated in FIG. 9A, an emitting pattern EP and a low adhesion pattern LAP are disposed on a first charge control layer CCL1. The emitting pattern EP may be provided before or after forming the low adhesion pattern LAP. Each of the emitting pattern EP and the low adhesion pattern LAP may be provided through a deposition or printing process.

Thereafter, as illustrated in FIG. 9B, a second charge control layer CCL2 is provided. As described above, a charge control material including a metal may be provided on the first charge control layer CCL1 and the low adhesion pattern LAP so that the second charge control layer CCL2 is disposed on an entire surface of the first charge control layer CCL1. Here, the second charge control layer CCL2 has low adhesion with respect to the low adhesion pattern LAP. Thus, it is difficult to stably form the second charge control layer CCL2 on the low adhesion pattern LAP.

Here, a first residue RS1 may be disposed on the low adhesion pattern LAP. The first residue RS1 may include the same material as that of the second charge control layer CCL2 and may be simultaneously provided together with the second charge control layer CCL2. The first residue RS1 may be provided such that a portion of the second charge control layer CCL2 remains on the low adhesion pattern LAP. The first residue RS1 may remain in the form of grains. The first residue RS1 may have a thickness less than that of the second charge control layer CCL2 and may partially cover the low adhesion pattern LAP.

Thereafter, as illustrated in FIG. 9C, a second electrode CT constitutes a light emitting element EE-1. The second electrode CT may be provided by providing a conductive material on the entire surface of the second charge control layer CCL2. As described above, the second electrode CT has low adhesion with respect to the low adhesion pattern LAP. Thus, it is difficult to stably form the second charge control layer CCL2 on the low adhesion pattern LAP.

Here, a second residue RS2 may be disposed on the low adhesion pattern LAP. The second residue RS2 may remain in the form of grains. The second residue RS2 includes the same material as that of the second electrode CT and may be simultaneously provided together with the second electrode CT. The second residue RS2 may have a thickness less than that of the second electrode CT and may be provided in an area of the low adhesion pattern LAP, which is exposed from the first residue RS1.

The first residue RS1 and the second residue RS2 may form a residual part RSF. The residual part RSF may be provided in a shape that entirely covers a top surface of the low adhesion pattern LAP or exposes at least a portion of the low adhesion pattern LAP. The residual part RSF may have a thickness less than that of the second charge control layer CCL2 or the second electrode CT. Thus, even when the residual part RSF is further provided in the area in which the low adhesion pattern LAP is disposed, a relatively high transmittance may be provided when compared to the light emitting element EE-1.

Figure 10A:
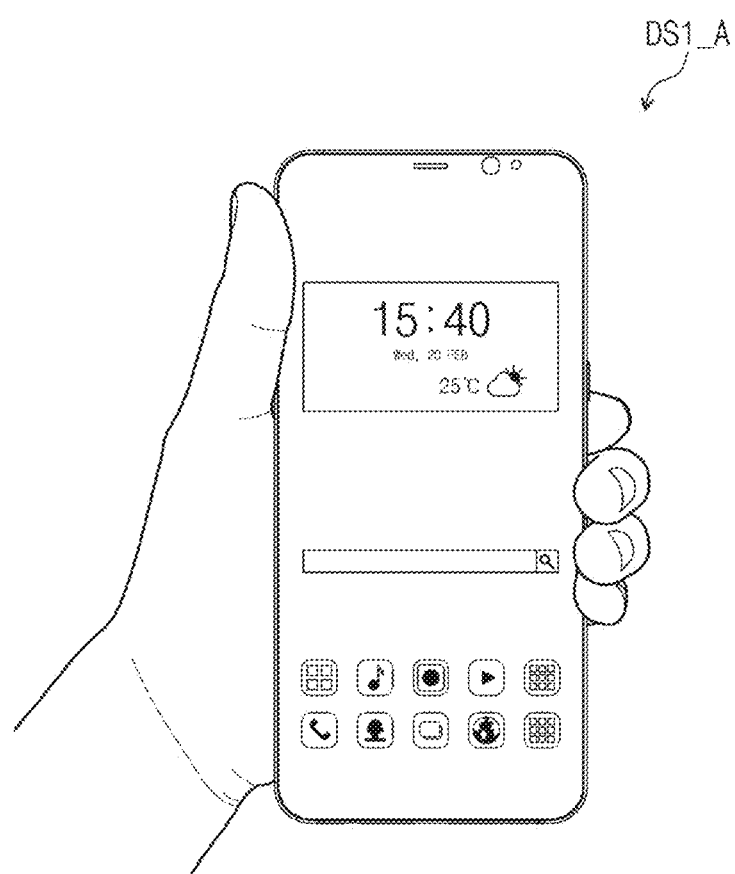
FIGS. 10A and 10B are plan views of an embodiment of a display apparatus according to the invention.
Figure 10B:
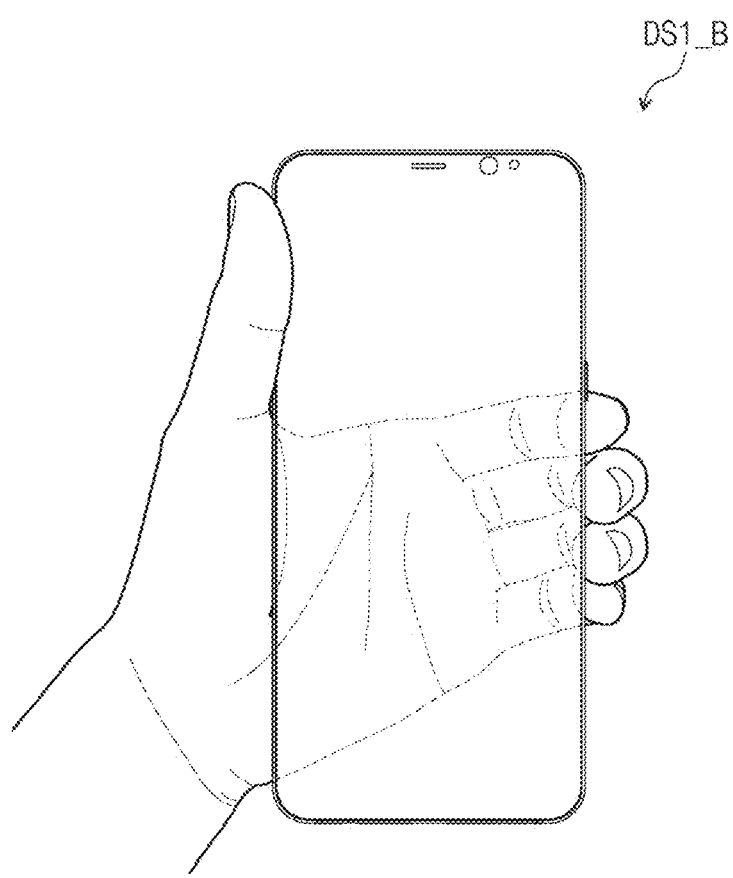

FIGS. 10A and 10B are plan views of an embodiment of a display apparatus according to the invention. FIG. 10A illustrates a display apparatus DS1_A in a state in which an image is displayed, and FIG. 10B illustrates a display apparatus DS1_B in an off state in which an image is not displayed. The display apparatuses DS1_A and DS1_B illustrated in FIGS. 10A and 10B, respectively, may be substantially the same display apparatus except for an operation mode thereof.

As illustrated in FIG. 10A, the display apparatus DS1_A in the state in which an image is displayed displays an image on a screen. The image includes a still image and a moving image. In this drawing, a clock, an icon, a search window, and the like are illustrated as an embodiment of the image.

As illustrated in FIG. 10B, the display apparatus DS1_B in the off state in which an image is not displayed may be optically transparent. A user's hand disposed on a rear surface may be visually recognized through a screen of the display apparatus DS1_B in the off state in which an image is not displayed.

Although not shown, in the display apparatus in an embodiment of the invention, an image may be displayed in a state in which the screen is transparent. In an embodiment, in the display apparatus DS1_A in the state in which the image of FIG. 10A is displayed, an empty space of the screen, in which the clock, the icon, the search window, and the like are not displayed, may be transparent to the user's hand to be visually recognized, for example. The display apparatus in an embodiment of the invention may be provided in various manners when the display apparatus corresponds to a transparent display apparatus, but is not limited to any particular embodiment.

Figure 11A:
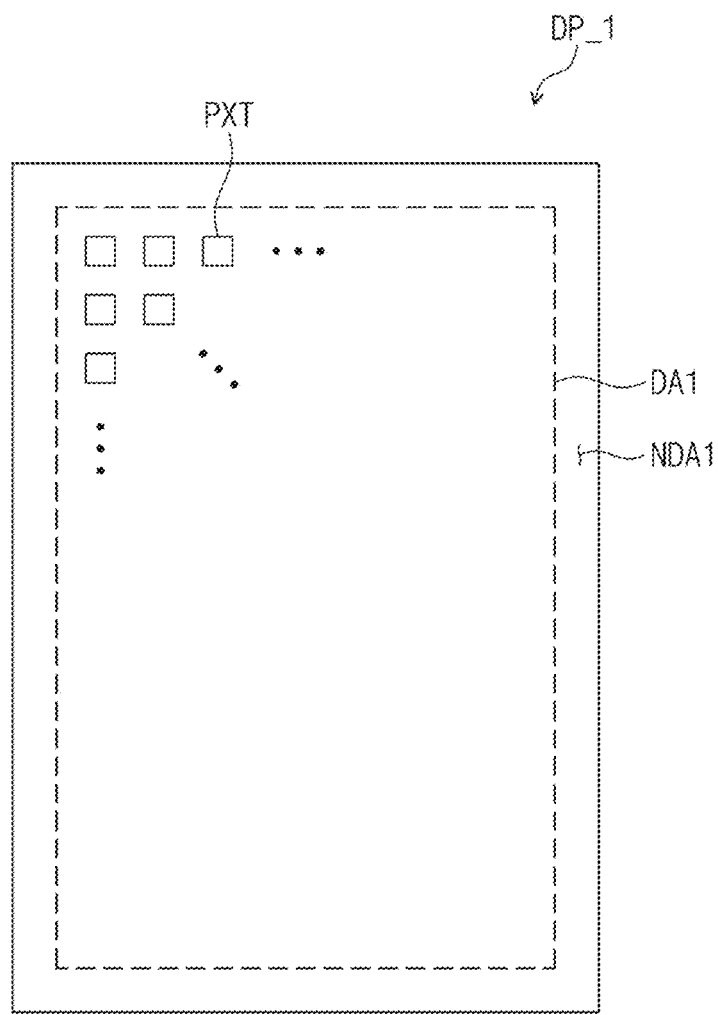
FIG. 11A is a plan view of an embodiment of the display panel according to the invention.
Figure 11B:
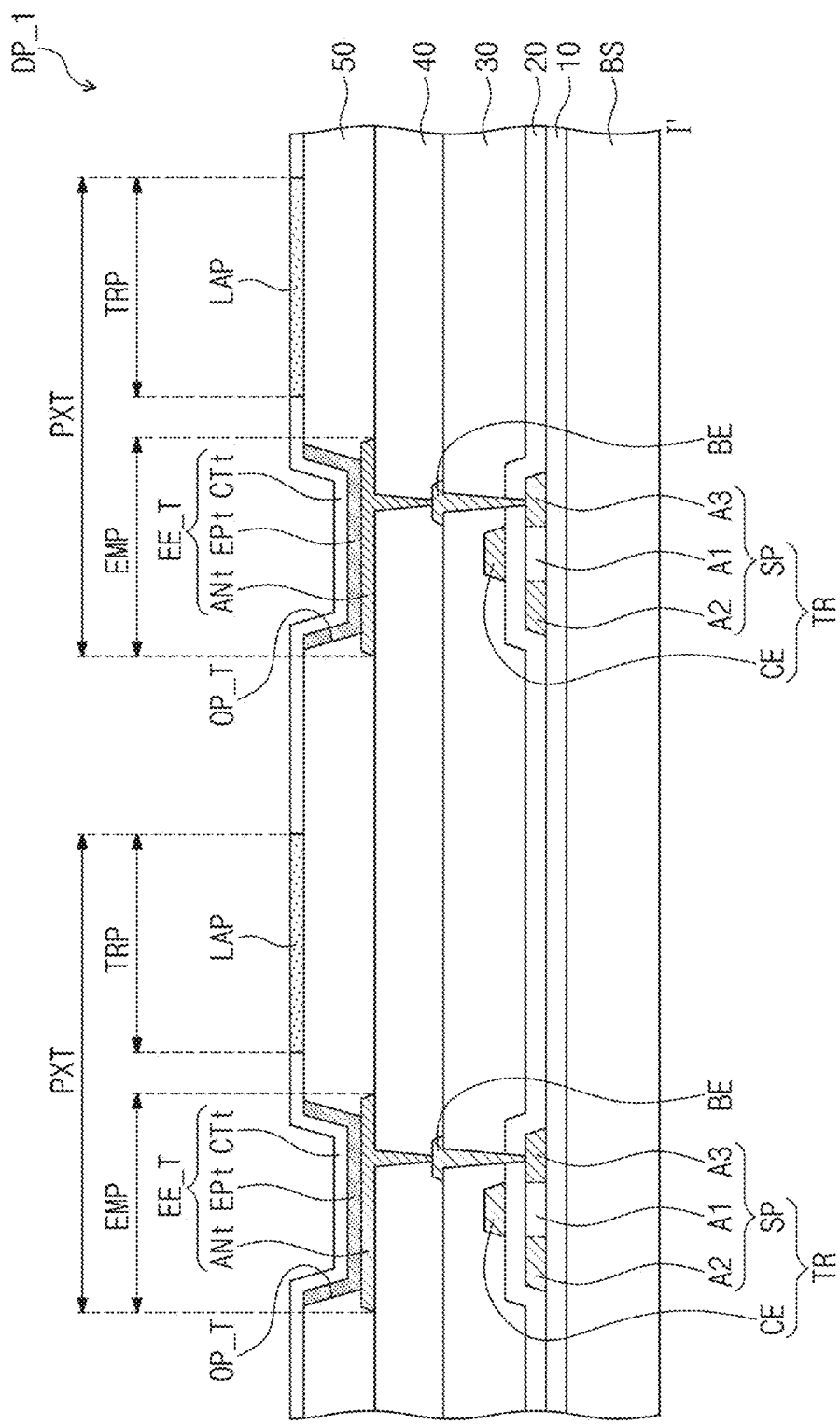
FIG. 11B is a cross-sectional view illustrating a portion of the display panel of FIG. 11A.

FIG. 11A is a plan view of an embodiment of the display panel according to the invention. FIG. 11B is a cross-sectional view illustrating a portion of the display panel of FIG. 11A. FIGS. 11A and 11B may be display panels constituting the display apparatuses DS1_A and DS1_B illustrated in FIGS. 10A and 10B. Hereinafter, the invention will be described with reference to FIGS. 11a and 11B.

As illustrated in FIG. 11A, a display panel may include a plurality of transmission pixels PXT. The transmission pixels PXT may be arranged in the display area. Each of the transmission pixels PXT is illustrated in a rectangular shape, but this is merely an example. In another embodiment, each of the transmission pixels PXT may be provided in various shapes such as a rhombus shape, a rectangular shape, a circular shape, an oval shape, etc., for example, but is not limited to a particular embodiment.

FIG. 11B schematically illustrates a cross-sectional view of two adjacent transmission pixels PXT in the display panel. As illustrated in FIG. 11B, the transmission pixel PXT includes an emitting part EMP and a transmitting part TRP. The emitting part EMP includes a light emitting element EE_T. The light emitting element EE_T is disposed in an opening OP_T defined in a fifth insulating layer 50.

The light emitting element EE_T is connected to a thin film transistor TR through a connection electrode BE. The light emitting element EE_T may include a first electrode ANt, an emitting pattern EPt, and a second electrode CTt. The light emitting element EE_T may correspond to the light emitting element EE_T illustrated in FIG. 4A. Hereinafter, duplicated descriptions will be omitted.

The transmitting part TRP is provided so as not to overlap the emitting part EMP. The transmitting part TRP may be spaced apart from the emitting part EMP in a plan view. Although not shown, when the transmitting part TRP does not overlap the emitting part EMP, the transmitting part TRP may be disposed adjacent to the emitting part EMP, but is not limited to any particular embodiment.

The transmitting part TRP includes a low adhesion pattern LAP. The low adhesion pattern LAP includes fluorine. The low adhesion pattern LAP may interfere with stable formation of the second electrode CTt. Thus, the low adhesion pattern LAP may not overlap the second electrode CTt in a plan view. The transmitting part TRP may have a relatively high light transmittance when compared to the emitting part EMP because the transmitting part TRP does not overlap the first electrode Ant and the second electrode CTt, which are optically transparent. Duplicated description will be omitted.

In an embodiment of the invention, the display panel may provide a transparent area over an entire display area by constituting the display area with the transmission pixels PXT. Thus, the display panel may display an image on the display area and provide the transparent area.

According to the invention, the display panel, which includes the transparent area with respect to the partial area or the entire display area, and the display apparatus may be easily provided. In addition, according to the invention, the transparent area may be easily provided without the separate mask or the additional process. Therefore, the process may be simplified, and the process cost may be reduced.

It will be apparent to those skilled in the art that various modifications and deviations may be made in the invention. Thus, it is intended that the invention covers the modifications and deviations of this invention provided they come within the scope of the appended claims and their equivalents. Accordingly, the technical scope of the invention should not be limited to the contents described in the detailed description of the specification, but should be determined by the claims.

What is claimed is:

1. A method for manufacturing a display panel, the method comprising:
    forming a first electrode on a base substrate;
    forming a pixel defining layer on the first electrode;
    defining an opening in the pixel defining layer so that at least a portion of the first electrode is exposed;
    forming an emitting pattern in the opening;
    forming a low adhesion pattern, which comprises a fluorine-based carbon compound, on an area spaced apart from the first electrode; and
    forming a second electrode on the emitting pattern,
    wherein a material forming the second electrode is disposed on the emitting pattern and the low adhesion pattern, and
    at least a portion of the low adhesion pattern is exposed from the second electrode.

2. The method of claim 1, further comprising forming a charge control layer between the emitting pattern and the second electrode,
    wherein a material forming the charge control layer is provided on the emitting pattern and the low adhesion pattern, and
    at least a portion of the low adhesion pattern is exposed from the charge control layer.

3. The method of claim 1, wherein a portion of the material forming the second electrode remains on the low adhesion pattern to form a residual part.

* * * * *